(12) United States Patent
Yamada et al.

(10) Patent No.: US 12,534,803 B2
(45) Date of Patent: Jan. 27, 2026

(54) FILM FORMING METHOD

(71) Applicant: Tokyo Electron Limited, Tokyo (JP)

(72) Inventors: Hiroki Yamada, Nirasaki (JP); Ryota Ifuku, Nirasaki (JP); Takashi Matsumoto, Nirasaki (JP); Nobutake Kabuki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 43 days.

(21) Appl. No.: 18/564,641

(22) PCT Filed: May 17, 2022

(86) PCT No.: PCT/JP2022/020448
§ 371 (c)(1),
(2) Date: Nov. 28, 2023

(87) PCT Pub. No.: WO2022/255080
PCT Pub. Date: Dec. 8, 2022

(65) Prior Publication Data
US 2024/0254626 A1 Aug. 1, 2024

(30) Foreign Application Priority Data
May 31, 2021 (JP) ................. 2021-091535

(51) Int. Cl.
*C23C 16/26* (2006.01)
*C23C 16/455* (2006.01)
(Continued)

(52) U.S. Cl.
CPC ........ *C23C 16/45538* (2013.01); *C23C 16/26* (2013.01); *C23C 16/45534* (2013.01);
(Continued)

(58) Field of Classification Search
CPC ........ C23C 16/26; C23C 16/511; C23C 16/52
See application file for complete search history.

(56) References Cited

U.S. PATENT DOCUMENTS

| 2011/0030991 A1* | 2/2011 | Veerasamy | B82Y 30/00 117/2 |
| 2012/0141799 A1* | 6/2012 | Kub | H10F 10/16 977/734 |

(Continued)

FOREIGN PATENT DOCUMENTS

| CN | 109824039 A | * | 5/2019 | ........... C01B 32/186 |
| CN | 110950328 A | * | 4/2020 | ........... C01B 32/184 |

(Continued)

OTHER PUBLICATIONS

Zhang, Jia, et al., "Low-Temperature Growth of Large-Area Heteroatom-Doped Graphene Film". Chemistry of Materials, 2014, 26, 2460-2466.*

(Continued)

*Primary Examiner* — Bret P Chen
(74) *Attorney, Agent, or Firm* — Armstrong Teasdale LLP

(57) ABSTRACT

A film forming method of forming a graphene film includes a loading process of loading a substrate into a processing container, a first process of forming the graphene film on the (Continued)

substrate using plasma of a first processing gas that includes a carbon-containing gas, and a second process of forming a doped graphene film on at least one of the substrate and the graphene film using plasma of a second processing gas that includes a dopant gas.

12 Claims, 16 Drawing Sheets

(51) Int. Cl.
*C23C 16/511* (2006.01)
*C23C 16/52* (2006.01)
*H01J 37/32* (2006.01)

(52) U.S. Cl.
CPC ...... *C23C 16/45544* (2013.01); *C23C 16/511* (2013.01); *C23C 16/52* (2013.01); *H01J 37/3222* (2013.01); *H01J 37/32449* (2013.01); *H01J 37/32201* (2013.01); *H01J 2237/332* (2013.01)

(56) References Cited

U.S. PATENT DOCUMENTS

| | | | | |
|---|---|---|---|---|
| 2014/0141355 | A1* | 5/2014 | Huang | H01M 4/583 427/535 |
| 2015/0037515 | A1* | 2/2015 | Fisher | C01B 32/182 427/577 |
| 2015/0247041 | A1* | 9/2015 | Papakonstantinou | C23C 16/26 428/408 |
| 2016/0343891 | A1* | 11/2016 | Heo | H10D 62/814 |
| 2020/0083053 | A1* | 3/2020 | Cho | C23C 16/26 |

FOREIGN PATENT DOCUMENTS

| | | | | |
|---|---|---|---|---|
| CN | 111203248 A | * | 5/2020 | ............ B01J 27/22 |
| JP | 2018-527471 A | | 9/2018 | |
| JP | 2019-055887 A | | 4/2019 | |
| WO | WO 2013052939 A1 | * | 4/2013 | ............ C01B 31/02 |
| WO | WO 2017/213045 A1 | * | 12/2017 | ............ C23C 16/26 |

OTHER PUBLICATIONS

Matsoso, Boitumelo, et al., "Time-dependent evolution of the nitrogen configurations in N-doped graphene films". RSC Adv., 2016 , 6, 106914-106920.*

Kanahashi, Kaito, et al., "Formation of environmentally stable hole-doped graphene films with instantaneous and high-density carrier doping via a boron-based oxidant". Nature Partner Journals: 2D Materials and Applications (2019) 7, pp. 1-7.*

Zhai, Zihao, et al., "Direct growth of nitrogen-doped graphene films on glass by plasma-assisted hot filament CVD for enhanced electricity generation". J. Mater. Chem. A,2019,7, 12038-12049.*

Wang, C.D., et al., "Plasma-assisted growth and nitrogen doping of graphene films". Appl. Phys. Lett. 100, 253107 (2012) pp.*

Kim et al., "Low-temperature synthesis of large-area graphene-based transparent conductive films using surface wave plasma chemical vapor deposition", Appl. Phys. Lett. 98, 091502 (2011); doi: 10.1063/1.3561747, 4 pages.

* cited by examiner

|  | SE1(80sec) | SE2(48→30sec) |
|---|---|---|
| N2 flow[sccm] | 100 | 100 |
| N atm% | 4.30 | 1.75 |
| N/C ratio | 5.597 | 2.061 |
| N | 44.68 | 24.09 |
| N-Pyridinic | 27.46 | 43.66 |
| N-pyrrolic | 19.15 | 32.78 |
| N-Graphitic | 0.00 | 16.79 |
| N-Pyridine Ox | 10.72 | 7.69 |

FILM FORMING METHOD

CROSS-REFERENCE TO RELATED APPLICATIONS

The present application is a U.S. National Stage Entry of International Patent Application No. PCT/JP2022/020448, filed May 17, 2022, which claims the benefit of priority to Japanese Patent Application No. 2021-091535, filed May 31, 2021, each of which is hereby incorporated herein by reference in its entirety.

TECHNICAL FIELD

The present disclosure relates to a film forming method and a film forming apparatus.

BACKGROUND

In recent years, a graphene film has been proposed as a new thin-film barrier layer material to replace a metal nitride film. In a graphene film forming technology, it has been proposed to use, for example, a microwave plasma chemical vapor deposition (CVD) apparatus to form a graphene film at a high radical density and a low electron temperature, thereby directly forming a graphene film on a silicon substrate, insulating film, or the like (e.g., Patent Document 1). Further, it has been proposed to irradiate a substrate with plasma containing $CH_4$ and $N_2$ and to generate a nitrogen-doped graphene film on the substrate (e.g., Patent Document 2).

PRIOR ART DOCUMENT

Patent Document

Patent Document 1: Japanese laid-open publication No. 2019-055887
Patent Document 2: International Publication No. 2017/213045

The present disclosure provides a film forming method and film forming apparatus which are capable of controlling the ratio of nitrogen-doped positions with respect to a graphene film.

SUMMARY

According to one aspect of the present disclosure, there is provided a film forming method of forming a graphene film, the film forming method including a loading process of loading a substrate into a processing container, a first process of forming the graphene film on the substrate using plasma of a first processing gas that includes a carbon-containing gas, and a second process of forming a doped graphene film on at least one of the substrate and the graphene film using plasma of a second processing gas that includes a dopant gas.

According to the present disclosure, it is possible to control the ratio of nitrogen-doped positions with respect to a graphene film.

BRIEF DESCRIPTION OF DRAWINGS

FIG. 11 is a diagram illustrating an example of comparing the experimental results between sequence SE1 and sequence SE2.

DETAILED DESCRIPTION

Hereinafter, embodiments of a film forming method and a film forming apparatus disclosed herein will be described in detail with reference to the drawings. In addition, the disclosed technology is not limited to the following embodiments.

In a nitrogen-doped graphene film, the substitution positions of nitrogen atoms may be broadly classified into three types. The first type is graphitic type, where a carbon atom at the center of three six-membered rings is substituted by a nitrogen atom. The second type is pyridinic type, where a carbon atom at an end of a six-membered ring at an end of the grain is substituted by a nitrogen atom. The third type is pyrrolic type, where a carbon atom at an end of a six-membered ring is substituted by a nitrogen atom to form a five-membered ring. It is difficult to control the ratios of these graphitic type, pyridinic type, and pyrrolic type, i.e., the ratio of nitrogen-doped positions with respect to the graphene film. Therefore, there is an expectation to control the ratio of nitrogen-doped positions with respect to the graphene film.

[Configuration of Film Forming Apparatus 1]

Figure 1:
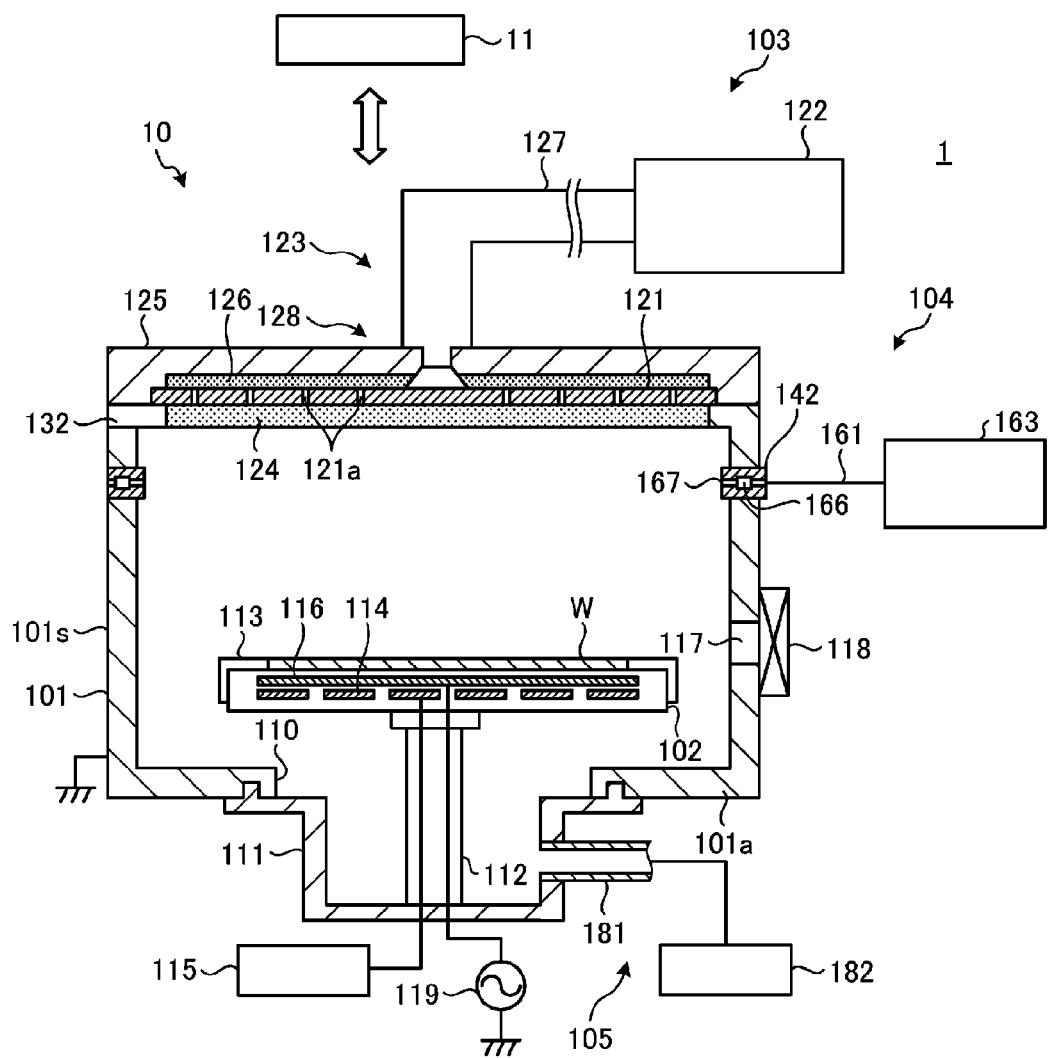
FIG. 1 is a schematic cross-sectional view illustrating an example of a film forming apparatus according to an embodiment of the present disclosure.

FIG. 1 is a schematic cross-sectional view illustrating an example of a film forming apparatus according to an embodiment of the present disclosure. The film forming apparatus 1 illustrated in FIG. 1 is configured as a plasma processing apparatus that employs, for example, a RLSA (registered trademark) microwave plasma method. In addition, the film forming apparatus 1 is an example of a substrate processing apparatus.

The film forming apparatus 1 includes an apparatus main body 10 and a controller 11 that controls the apparatus main body 10. The apparatus main body 10 includes a chamber 101, a stage 102, a microwave introduction mechanism 103, a gas supply mechanism 104, and an exhaust mechanism 105.

The chamber 101 is formed in a substantially cylindrical shape, and an opening 110 is formed at an approximately central portion of a bottom wall 101a of the chamber 101. The bottom wall 101a is provided with an exhaust chamber 111 that communicates with the opening 110 and protrudes downward. An opening 117 through which a substrate (hereinafter also referred to as a wafer) W passes is formed in a sidewall 101s of the chamber 101. The opening 117 is opened and closed by a gate valve 118. In addition, the chamber 101 is an example of a processing container.

The substrate W, which is a processing target, is placed on the stage 102. The stage 102 has an approximately disc shape and is made of ceramics such as AlN. The stage 102 is supported by a cylindrical support member 112 made of ceramics such as AlN, which extends upward from approximately the center of the bottom of the exhaust chamber 111. An edge ring 113 is provided on the outer edge of the stage 102 to surround the substrate W placed on the stage 102. Further, a lifting pin (not illustrated) for raising and lowering the substrate W is provided inside the stage 102 so as to be able to protrude to and retract from an upper surface of the stage 102.

Furthermore, a resistive heating type heater 114 is embedded inside the stage 102. The heater 114 heats the substrate W placed on the stage 102 upon receiving power supplied from a heater power supply 115. Further, a thermocouple (not illustrated) is inserted into the stage 102, and the temperature of the substrate W is controllable to, for example, the range of 350 degrees C. to 850 degrees C. based on a signal from the thermocouple. Furthermore, an electrode 116 having approximately the same size as the substrate W is embedded inside the stage 102 above the heater 114, and a bias power supply 119 is electrically connected to the electrode 116. The bias power supply 119 supplies bias power having a predetermined frequency and magnitude to the electrode 116. The bias power supplied to the electrode 116 allows ions to be drawn into the substrate W placed on the stage 102. In addition, the bias power supply 119 may not be provided according to the characteristics of a plasma processing.

The microwave introduction mechanism 103 is provided at the top of the chamber 101 and includes an antenna 121, a microwave output part 122, and a microwave transmitter 123. The antenna 121 has a plurality of slots 121a formed therein, which are through-holes. The microwave output part 122 outputs microwaves. The microwave transmitter 123 guides the microwaves output from the microwave output part 122 to the antenna 121.

A dielectric window 124 made of dielectrics is provided below the antenna 121. The dielectric window 124 is supported by a support member 132, which is provided in a ring shape at the top of the chamber 101. A wave delay plate 126 is provided on the antenna 121. A shield member 125 is provided on the antenna 121. A flow path (not illustrated) is provided inside the shield member 125. The shield member 125 is used to cool the antenna 121, the dielectric window 124, and the wave delay plate 126 by a fluid such as water flowing through the flow path.

The antenna 121 is made of, for example, a copper plate or aluminum plate with a silver- or gold-plated surface, and the plurality of slots 121a for microwave radiation are arranged therein in a predetermined pattern. The arrangement pattern of the slots 121a is appropriately set to ensure even microwave radiation. An example of a suitable pattern is a radial line slot pattern where a plurality of pairs of slots 121a is concentrically arranged, with two slots 121a arranged in a T-shape as a pair. The length and arrangement spacing of the slots 121a are appropriately determined depending on the effective wavelength ($\lambda$g) of microwaves. Further, the slots 121a may also have other shapes such as a circular shape and an arc shape. Furthermore, the arrangement pattern of the slots 121a is not particularly limited, and may have, for example, a spiral shape or a radial shape, in addition to the concentric shape. The pattern of the slots 121a is appropriately set to achieve microwave radiation characteristics by which desired plasma density distribution is obtained.

The wave delay plate 126 is made of dielectrics with a higher dielectric constant than vacuum such as quartz, ceramics ($Al_2O_3$), polytetrafluoroethylene, and polyimide. The wave delay plate 126 has a function of reducing the wavelength of microwaves compared to that in vacuum, thus making the antenna 121 smaller in size. In addition, the dielectric window 124 is also made of a same dielectrics.

The thicknesses of the dielectric window 124 and the wave delay plate 126 are adjusted to ensure that an equivalent circuit, which is constituted by the wave delay plate 126, the antenna 121, the dielectric window 124, and plasma, satisfies resonance conditions. The adjustment of the thickness of the wave delay plate 126 may lead to the adjustment of the phase of microwaves. By adjusting the thickness of the wave delay plate 126 to make the junction of the antenna 121 correspond to the "antinode" of standing waves, microwave reflection may be minimized and the radiative energy of microwaves may be maximized. Further, when using the same material for the wave delay plate 126 and the dielectric window 124, interface reflection of microwaves may be prevented.

The microwave output part 122 has a microwave oscillator. The microwave oscillator may be of a magnetron type or a solid-state type. The frequency of microwaves generated by the microwave oscillator is, for example, in the range of 300 MHz to 10 GHz. As an example, the microwave output part 122 outputs microwaves of 2.45 GHz using a magnetron-type microwave oscillator. The microwaves are an example of electromagnetic waves.

The microwave transmitter 123 includes a waveguide 127 and a coaxial waveguide 128. In addition, it may further include a mode converter. The waveguide 127 guides the microwaves output from the microwave output part 122. The coaxial waveguide 128 includes an inner conductor connected to the center of the antenna 121 and an outer conductor around the inner conductor. The mode converter is provided between the waveguide 127 and the coaxial waveguide 128. The microwaves output from the microwave output part 122 propagate within the waveguide 127 in a TE mode and are converted from the TE mode to a TEM mode by the mode converter. The microwaves converted into the TEM mode propagate to the wave delay plate 126 through the coaxial waveguide 128 and are radiated from the wave delay plate 126 into the chamber 101 through the slots 121a of the antenna 121 and the dielectric window 124. In addition, a tuner (not illustrated) is provided in the middle of the waveguide 127 to match the impedance of a load (plasma) in the chamber 101 with the output impedance of the microwave output part 122.

The gas supply mechanism 104 includes a shower ring 142 provided on a ring along an inner wall of the chamber 101. The shower ring 142 has a ring-shaped flow path 166 provided therein and a plurality of discharge ports 167 connected to the flow path 166 and opened to the inner side of the flow path 166. A gas supplier 163 is connected to the flow path 166 via a pipe 161. The gas supplier 163 is provided with a plurality of gas sources and a plurality of flow controllers. In one embodiment, the gas supplier 163 is configured to supply at least one processing gas from a corresponding gas source to the shower ring 142 via a corresponding flow controller. The gas supplied to the shower ring 142 is supplied into the chamber 101 from the plurality of discharge ports 167.

Further, when a graphene film is formed on the substrate W, the gas supplier 163 supplies a carbon-containing gas, a hydrogen-containing gas, and a noble gas, which are controlled to a predetermined flow rate, into the chamber 101 via the shower ring 142. In the present embodiment, the carbon-containing gas is, for example, a $C_2H_2$ gas. In addition, instead of or in addition to the $C_2H_2$ gas, a $C_2H_4$ gas, $CH_4$ gas, $C_2H_6$ gas, $C_3H_8$ gas, $C_3H_6$ gas or the like may be used. In addition, in the present embodiment, the hydrogen-containing gas is, for example, a hydrogen gas. Further, instead of or in addition to the hydrogen gas, a halogen-based gas such as a fluorine ($F_2$) gas, chlorine ($Cl_2$) gas, or a bromine ($Br_2$) gas may be used. Further, in the present embodiment, the noble gas is, for example, an Ar gas. Instead of the Ar gas, other noble gases such as a He gas may be used.

The exhaust mechanism 105 includes the exhaust chamber 111, an exhaust pipe 181 provided on a sidewall of the exhaust chamber 111, and an exhaust device 182 connected to the exhaust pipe 181. The exhaust device 182 includes a vacuum pump and a pressure control valve, among others.

The controller 11 includes a memory, a processor, and an input/output interface. The memory stores programs executed by the processor and recipes including, e.g., conditions for each processing. The processor executes the programs read from the memory and controls each part of the apparatus main body 10 via the input/output interface based on the recipes stored in the memory.

For example, the controller 11 controls each part of the film forming apparatus 1 to perform a film forming method to be described later. In a detailed example, the controller 11 executes a loading process of loading the substrate (wafer) W into the chamber 101. The controller 11 executes a first process of forming a graphene film on the substrate using plasma of a first processing gas that includes a carbon-containing gas. The controller 11 executes a second process of forming a doped graphene film on at least one of the substrate and the graphene film using plasma of a second processing gas that includes a dopant gas. Here, the carbon-containing gas may be an acetylene ($C_2H_2$) gas supplied from the gas supplier 163. Further, the dopant gas may be a $N_2$ gas supplied from the gas supplier 163. Further, the carbon-containing gas is not limited to acetylene. For example, it may be a hydrocarbon gas such as ethylene ($C_2H_4$), methane ($CH_4$), ethane ($C_2H_6$), propane ($C_3H_8$), propylene ($C_3H_6$), or acetylene ($C_2H_2$) as well as a ring-shaped hydrocarbon gas such as benzene ($C_6H_6$), toluene ($C_7H_8$), ethylbenzene ($C_8H_{10}$), styrene ($C_8H_8$), or cyclohexane ($C_6H_{12}$). Moreover, the carbon-containing gas may be alcohols such as methanol ($CH_3OH$) and ethanol ($C_2H_5OH$). Further, the dopant gas is not limited to $N_2$. For example, ammonia ($NH_3$) may also be used. Further, the dopant gas is not limited to a nitrogen-containing gas. For example, it may be a boron-containing gas.

[Grain Boundary]

Figure 2:
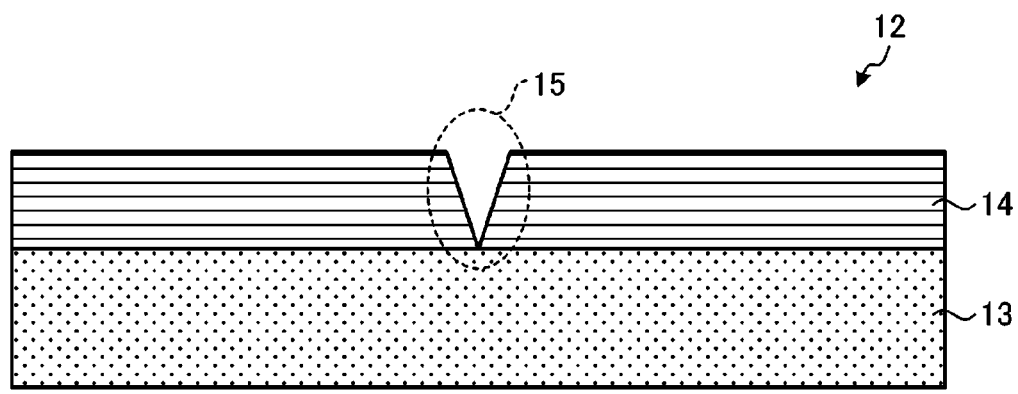
FIG. 2 is a view illustrating an example of a grain boundary.

Next, a grain boundary in a graphene film will be described with reference to FIG. 2. FIG. 2 is a view illustrating an example of a grain boundary. A wafer 12 illustrated in FIG. 2 represents a state where a graphene film 14 is formed on a silicon substrate 13. At this time, there may be the occurrence of a grain boundary (crystalline boundary) 15 in the graphene film 14. The occurrence of the grain boundary 15 in the graphene film 14 may make it difficult to secure barrier properties in a graphene monolayer. That is, the grain boundary 15 may become a diffusion path, causing elements to diffuse from the silicon substrate 13 or causing elements to diffuse from a metal-containing film, which is further formed on the graphene film 14, toward the side of the silicon substrate 13. To prevent the occurrence of the grain boundary 15, it is conceivable to reduce diffusion paths by doping graphene with another element. Therefore, in the present embodiment, a nitrogen-doped graphene film is produced. In addition, as an alternative element for doping in the graphene film, boron may be doped instead of nitrogen, and both boron and nitrogen may also be doped.

[Nitrogen-Doped Position]

Figure 3:
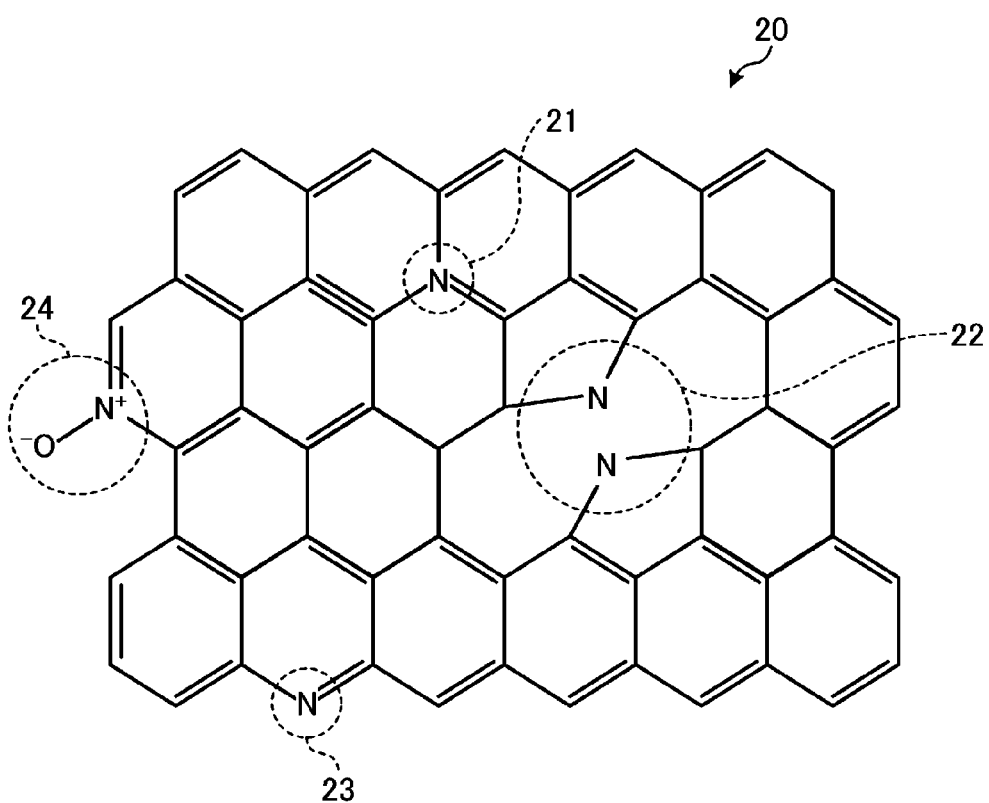
FIG. 3 is a view illustrating nitrogen-doped positions in a grain.

Next, nitrogen-doped positions will be described with reference to FIG. 3. FIG. 3 is a view illustrating nitrogen-doped positions in a grain. As illustrated in FIG. 3, a grain 20 includes a graphitic type 21, a pyrrolic type 22, a pyridinic type 23, and a pyridine oxide type 24. As described above, the graphitic type 21 is a type where a carbon atom at the center of three six-membered rings is substituted by a nitrogen atom. The pyrrolic type 22 is a type where a carbon atom at an end of six-membered ring is substituted by a nitrogen atom to form a five-membered ring. The pyridinic type 23 is a type where a carbon atom at an end of a six-membered ring at an end of the grain 20 is substituted by a nitrogen atom. The pyridine oxide type 24 is a type where the nitrogen atom of the pyridinic type 23 is accompanied by an oxygen atom to form an oxide. In the following description, the graphitic type 21 may be referred to as "N-Graphitic", the pyrrolic type 22 as "N-pyrrolic", the pyridinic type 23 as "N-pyridinic", and the pyridine oxide type 24 as "N-Pyridine oxide".

[Sequence List]

Figure 4:
FIG. 4 is a view illustrating an example of combinations of respective processes for each sequence according to the present embodiment.

Next, combinations of respective processes of a film forming process will be described as a sequence list with reference to FIG. 4. FIG. 4 is a view illustrating an example of combinations of respective processes for each sequence according to the present embodiment. Table 30 illustrated in FIG. 4 represents combinations of a first process to a fourth process of a film forming process as sequences SE1 to SE11. In table 30, the processes marked with are the executed processes. In addition, the following description will be given for a case of using a $N_2$ gas as a dopant gas.

The first process is a process of forming a graphene film on the substrate W using plasma of a first processing gas that includes a carbon-containing gas. The second process is a process of forming a doped graphene film on at least one of the substrate W and the graphene film using plasma of a second processing gas that includes a $N_2$ gas.

The third process is a process of processing at least one of the graphene film and the doped graphene film using plasma of a third processing gas that includes a $N_2$ gas and an Ar gas. The fourth process is a process of processing at least one of the graphene film and the doped graphene film using plasma of a fourth processing gas that includes a $N_2$ gas and does not include an Ar gas. In addition, the third process and the fourth process are processes of modifying a surface of at least one of the graphene film and the doped graphene film on the substrate W. This modification allows the graphene film and the doped graphene film on the substrate W to be doped with nitrogen.

Sequence SE1 includes, after loading the substrate W into the chamber 101, performing only the second process to form a doped graphene film on the substrate W, followed by unloading the substrate W.

Sequence SE2 includes, after loading the substrate W into the chamber 101, performing the first process to form a graphene film on the substrate W, and then performing the second process to form a doped graphene film on the graphene film, followed by unloading the substrate W.

Sequence SE3 includes, after loading the substrate W into the chamber 101, performing, as the second process, a cycle processing of forming a doped graphene film using plasma of the second processing gas while intermittently supplying a first dopant gas ($N_2$ gas) to form the doped graphene film on the substrate W, followed by unloading the substrate W. In addition, in sequence SE3, the cycle processing as the second process may be performed after completing the first process, following the loading of the substrate W into the chamber 101.

Sequence SE4 includes, after loading the substrate W into the chamber 101, performing the first process to form a graphene film on the substrate W, and then performing the third process to dope the graphene film with nitrogen to form a doped graphene film, followed by unloading the substrate W.

Sequence SE5 includes, after loading the substrate W into the chamber 101, performing the second process to form a doped graphene film on the substrate W, and then performing the third process to further dope the doped graphene film with nitrogen, followed by unloading the substrate W.

Sequence SE6 includes, after loading the substrate W into the chamber 101, performing the first process to form a graphene film on the substrate W, then performing the second process to form a doped graphene film on the graphene film, and finally performing the third process to further dope the doped graphene film with nitrogen, followed by unloading the substrate W.

Sequence SE7 includes, after loading the substrate W into the chamber 101, performing, as the second process, the cycle processing of sequence SE3 to form a doped graphene film on the substrate W, and then performing the third process to further dope the doped graphene film with nitrogen, followed by unloading the substrate W. In addition, in sequence SE7, the cycle processing of sequence SE3 may be performed as the second process after completing the first process after the loading of the substrate W into the chamber 101.

Sequence SE8 includes performing, after the third process of sequence SE4, the fourth process to dope at least one of the graphene film and the doped graphene film with nitrogen to form a doped graphene film, followed by unloading the substrate W. In addition, in sequence SE8, the third process may transition to the fourth process while maintaining the plasma from the first process.

Sequence SE9 includes performing, after the third process of sequence SE5, the fourth process to further dope the doped graphene film with nitrogen to form a doped graphene film, followed by unloading the substrate W. In addition, in sequence SE9, the third process may transition to the fourth process while maintaining the plasma from the second process.

Sequence SE10 includes performing, after the third process of sequence SE6, the fourth process to further dope the doped graphene film with nitrogen to form a doped graphene film, followed by unloading the substrate W. In addition, in sequence SE10, the third process may transition to the fourth process while maintaining the plasma from the second process.

Sequence SE11 includes performing, after the third process of sequence SE7, the fourth process to further dope the doped graphene film with nitrogen to form a doped graphene film, followed by unloading the substrate W. In addition, in sequence SE11, the third process may transition to the fourth process while maintaining the plasma from the second process.

[Film Forming Method]
<Sequence SE2>

Figure 5:
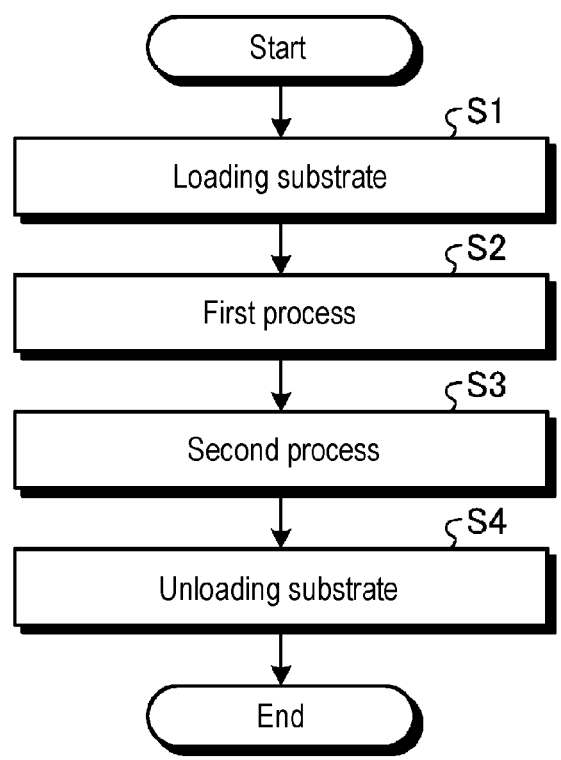
FIG. 5 is a flowchart illustrating an example of a film forming process according to the present embodiment.

Next, a film forming process according to the present embodiment will be described. FIG. 5 is a flowchart illustrating an example of a film forming process according to the present embodiment. In the film forming process of FIG. 5, sequence SE2 will be described by way of example.

In the film forming process according to the present embodiment, first, the controller 11 controls the gate valve 118 to open the opening 117. When the opening 117 is open, the substrate W is loaded into a processing space of the chamber 101 through the opening 117 and is placed on the stage 102. That is, the controller 11 loads substrate W into the chamber 101 (step S1). The controller 11 controls the gate valve 118 to close the opening 117.

The controller 11 reduces the internal pressure of the chamber 101 to a first pressure (e.g., 5 mTorr to 1 Torr). Further, the controller 11 controls the temperature of the substrate W to a predetermined temperature (e.g., 300 degrees C. or higher). The controller 11 controls the supply of a first processing gas, which is a plasma generation gas, from the discharge ports 167 into the chamber 101. The first processing gas is a gas that includes a carbon-containing gas. The carbon-containing gas is, for example, a gas containing acetylene ($C_2H_2$). Further, the first processing gas may include a hydrogen gas or argon gas. Further, the controller 11 guides the microwaves output from the microwave output part 122 of the microwave introduction mechanism 103 to the antenna 121 and radiates the microwaves from the antenna 121 to ignite plasma. The controller 11 executes a first process using the plasma of the first processing gas for a predetermined time (e.g., 5 seconds to 60 minutes) (step S2). In the first process, a graphene film is formed on the substrate W.

When the first process is completed, the controller 11 controls the supply of a second processing gas, which is a plasma generation gas, from the discharge ports 167 into the chamber 101 while maintaining the plasma of the first processing gas. The second processing gas is, for example, a mixed gas including the first processing gas and a $N_2$ gas. That is, the controller 11 controls the supply of the $N_2$ gas into the chamber 101 from the discharge ports 167 while supplying the first processing gas into the chamber 101. The controller 11 executes a second process using the plasma of the second processing gas for a predetermined time (e.g., 5 seconds to 60 minutes) (step S3). In addition, the flow rate of the second processing gas in the second process is different from the flow rate of the first processing gas in the first process. Further, in the second process, the internal pressure of the chamber 101 may be changed to a second pressure (e.g., 5 mTorr to 1 Torr). In the second process, a doped graphene film is formed on the graphene film.

When the second process is completed, the controller 11 controls the gate valve 118 to open the opening 117. The controller 11 protrudes the lifting pins (not illustrated) from the upper surface of the stage 102 to raise the substrate W. When the opening 117 is open, the substrate W is unloaded from the chamber 101 by an arm of a transfer chamber (not illustrated) through the opening 117. That is, the controller 11 controls the unloading of the substrate W from the chamber 101 (step S4). When the unloading of the substrate W is completed, the controller 11 ends the film forming process. In addition, if the first process is omitted in the film forming process of FIG. 5, it becomes sequence SE1.

The controller 11 may execute a cleaning process of cleaning the interior of the chamber 101 after the unloading of the substrate W. In the cleaning process, a dummy wafer is placed on the stage 102 and a cleaning gas is supplied into the chamber 101 to clean a carbon film such as an amorphous carbon film adhered to the inner wall of the chamber 101. In addition, the cleaning gas may be an $O_2$ gas, but may be an oxygen-containing gas such as a CO gas or $CO_2$ gas. Further, the cleaning gas may include a noble gas such as an Ar gas. Further, the dummy wafer may be omitted. The cleaning process may be performed for each processing, or may be performed for every specific number of processed substrates.

<Sequence SE3>

Figure 6:
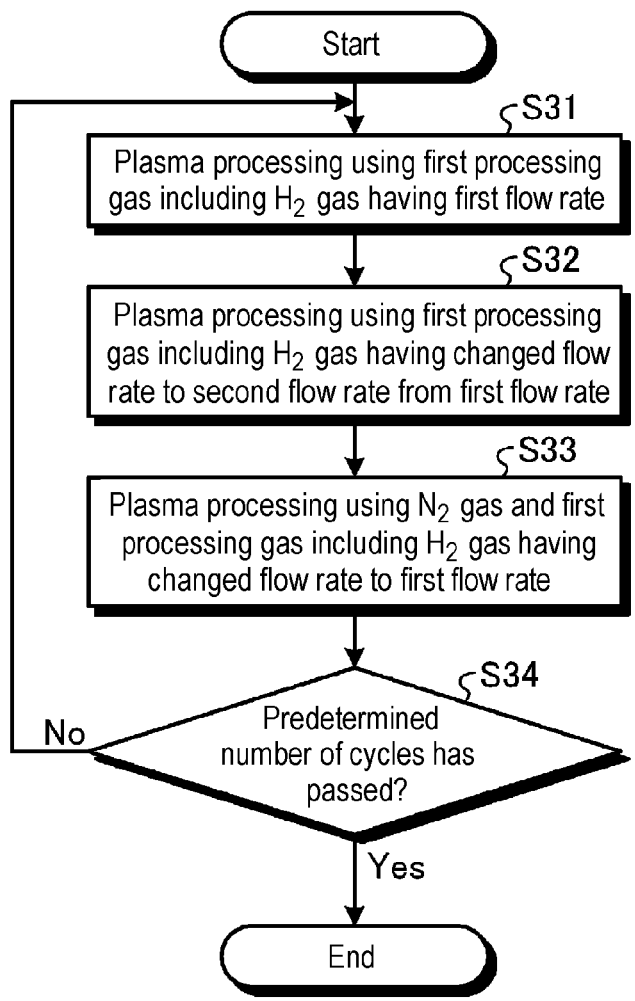
FIG. 6 is a flowchart illustrating an example of a partial film forming process of sequence SE3 according to the present embodiment.

Next, sequence SE3 will be described with reference to FIG. 6. FIG. 6 is a flowchart illustrating an example of a partial film forming process of sequence SE3 according to the present embodiment. Sequence SE3 differs in that it includes the cycle processing in the film forming process step 3 (the second process) of sequence SE2. Here, only the different cycle processing will be described, and a description of the other steps will be omitted since they are the same as those in sequence SE2.

When the first process in step S2 is completed, the controller 11 executes a plasma processing for a predetermined time (e.g., 5 seconds) while maintaining the plasma of the first processing gas that includes a carbon-containing gas and a $H_2$ gas at a first flow rate from the discharge ports 167 (step S31). Next, the controller 11 changes the flow rate of the $H_2$ gas of the first processing gas from the discharge ports 167 from the first flow rate to a second flow rate (e.g., change to the second flow rate greater than the first flow rate) and executes a plasma processing for a predetermined time (e.g., 5 seconds) using plasma of the first processing gas with the changed flow rate of $H_2$ gas (step S32). The first flow rate of the $H_2$ gas is, for example, in the range of 0 to 100 sccm, and the second flow rate of the $H_2$ gas is, for example, in the range of 0 to 100 sccm.

Next, the controller 11 changes the flow rate of the $H_2$ gas of the first processing gas from the discharge ports 167 to the first flow rate and controls the supply of a mixed gas including the first processing gas and a $N_2$ gas to the chamber 101. That is, the controller 11 controls the supply of the $N_2$ gas into the chamber 101 from the discharge ports 167 while supplying the first processing gas into the chamber 101. At this time, the flow rate of the $N_2$ gas is, for example, 100 sccm. The controller 11 executes a plasma processing for a predetermined time (e.g., 5 seconds) using plasma of the mixed gas including the first processing gas and the $N_2$ gas. Then, the controller stops the supply of the $N_2$ gas after a predetermined time has passed (step S33).

The controller 11 determines whether or not the processing of steps S31 to S33 has passed a predetermined number of cycles (e.g., 6 cycles) (step S34). If the controller 11 determines that the predetermined number of cycles has not passed (step S34: "No"), the controller 11 returns to step S31. If the controller 11 determines that the predetermined number of cycles has passed (step S34: "Yes"), the controller 11 ends the cycle processing. In addition, in the following description, this cycle processing pattern is referred to as sequence SE3-C.

Further, in the cycle processing, the plasma processing using the first processing gas with the changed flow rate of the $H_2$ gas in step S32 may be omitted, and steps S31 and S33 may be repeated. In the following description, this cycle processing pattern is referred to as sequence SE3-B.

Furthermore, among the processing steps similar to those in sequence SE2, the first process in step S2 and the plasma processing using the $H_2$ gas in step S32 of the cycle processing may be omitted. In other words, the cycle processing includes repeating only steps S31 and S33. In the following description, this cycle processing pattern is referred to as sequence SE3-A.

<Sequence SE6>

Figure 7:
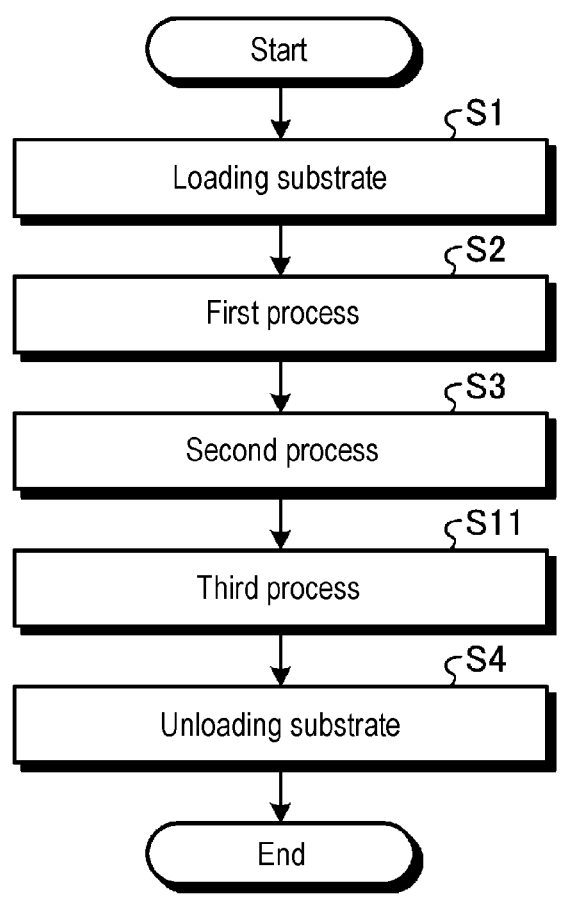
FIG. 7 is a flowchart illustrating an example of a film forming process according to the present embodiment.

Next, a film forming process in sequence SE6 will be described with reference to FIG. 7. FIG. 7 is a flowchart illustrating an example of a film forming process according to the present embodiment. In addition, in sequence SE6, the processing of steps S1 to S4 of the film forming process are the same as those in sequence SE2, and thus, a description thereof will be omitted.

When the second process in step S3 is completed, the controller 11 controls the supply of a third processing gas, which is a plasma generation gas, from the discharge ports 167 into the chamber 101 while maintaining the plasma of the second processing gas. The third processing gas is, for example, a mixed gas including a $N_2$ gas and an Ar gas. The controller 11 executes a third process using plasma of the third processing gas for a predetermined time (e.g., 5 seconds to 60 minutes) (step S11). In the third process, a treatment is performed on a surface of the doped graphene film to dope the doped graphene film with nitrogen. In addition, in the third process, the internal pressure of the chamber 101 may be changed to a third pressure (e.g., 5 mTorr to 5 Torr). When the third process is completed, the controller 11 proceeds to step S4.

In addition, sequence SE6 may proceed from the first process (step S2) to the third process (step S11) with omission of the second process (step S3). This corresponds to sequence SE4. In this case, in the third process, a surface of the graphene film is modified and doped with nitrogen.

Further, sequence SE6 may proceed from the loading the substrate W into the chamber 101 to the second process (step S3) with omission of the first process (step S2). This corresponds to sequence SE5. In this case, in the third process (step S11), a surface of the doped graphene film is modified and doped with nitrogen.

In addition, in sequence SE6, the first process (step S2) may be omitted, and the second process (step S3) may be performed in the same manner as the second process of the cycle processing of sequence SE3. This corresponds to sequence SE7. In this case, in the third process (step S11), a surface of the doped graphene film is modified and doped with nitrogen.

<Sequence SE10>

Figure 8:
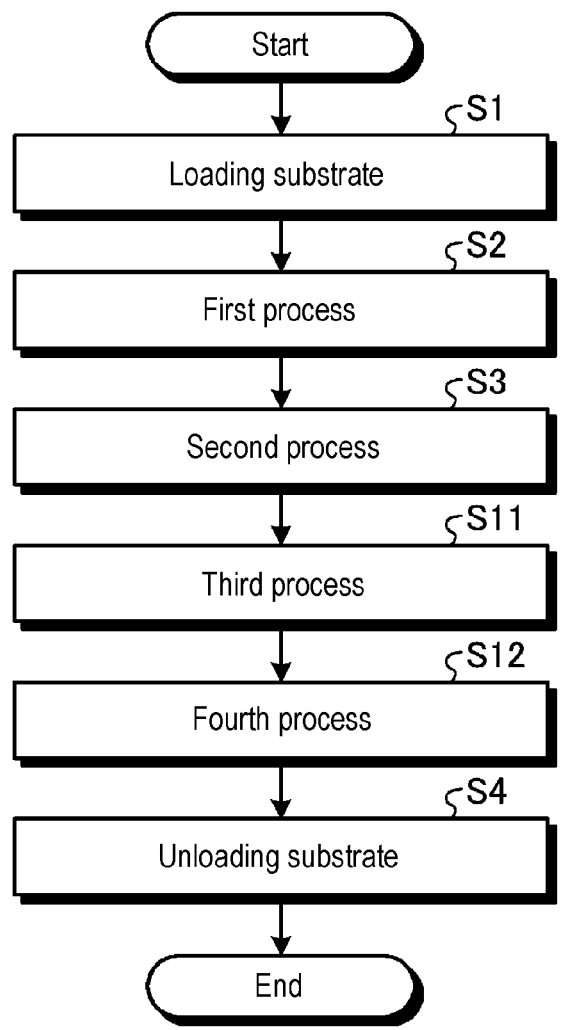
FIG. 8 is a flowchart illustrating an example of a film forming process according to the present embodiment.

Next, a film forming process in sequence SE10 will be described with reference to FIG. 8. FIG. 8 is a flowchart illustrating an example of a film forming process according to the present embodiment. In addition, in sequence SE10, the processing of steps S1 to S5 and S11 of the film forming process are the same as those in sequence SE6, and thus, a description thereof will be omitted.

When the third process in step S11 is completed, the controller 11 controls the supply of a fourth processing gas, which is a plasma generation gas, from the discharge ports 167 into the chamber 101 while maintaining the plasma of the third processing gas. The fourth processing gas is, for example, a mixed gas that includes a $N_2$ gas and does not include an Ar gas. The controller 11 executes a fourth process using plasma of the fourth processing gas for a predetermined time (e.g., 5 seconds to 60 minutes) (step S12). In the fourth process, a surface of the doped graphene film is modified and doped with nitrogen. In addition, in the fourth process, the internal pressure of the chamber 101 may be changed to a fourth pressure (e.g., 5 mTorr to 5 Torr). When the fourth process is completed, the controller 11 proceeds to step S4. In addition, the processing time of the third process in step S11 of sequence SE10 may be a time required for transition from the second process to the fourth process while maintaining the plasma (e.g., 1 second to 60 minutes).

In addition, sequence SE10 may proceed from the first process (step S2) to the third process (step S11) with omission of the second process (step S3). This corresponds to sequence SE8. In this case, in the third process (step S11) and the fourth process (step S12), for at least one of the graphene film and the doped graphene film, a surface thereof is modified and doped with nitrogen. In addition, when the processing time of the third process is short, no doped graphene film is formed in the third process, and the graphene film is doped with nitrogen in the fourth process.

Further, sequence SE10 may proceed from the loading of the substrate W into the chamber 101 to the second process (step S3) with omission of the first process (step S2). This corresponds to sequence SE9. In this case, in the third process (step S11) and the fourth process (step S12), a surface of the doped graphene film is modified and doped with nitrogen. In addition, when the processing time of the third process is short, no doped graphene film is formed in the third process, and the graphene film is doped with nitrogen in the fourth process.

In addition, in sequence SE10, the first process (step S2) may be omitted, and the second process (step S3) may be performed in the same manner as the second process of the cycle processing of sequence SE3. This corresponds to sequence SE11. In this case, in the third process (step S11) and the fourth process (step S12), a surface of the doped graphene film is modified and doped with nitrogen. In addition, when the processing time of the third process is short, no doped graphene film is formed in the third process, and the graphene film is doped with nitrogen in the fourth process.

[Experiment Results]

Next, the experimental results will be described with reference to FIGS. 9 to 17.

<Sequence SE1>

Figure 9:
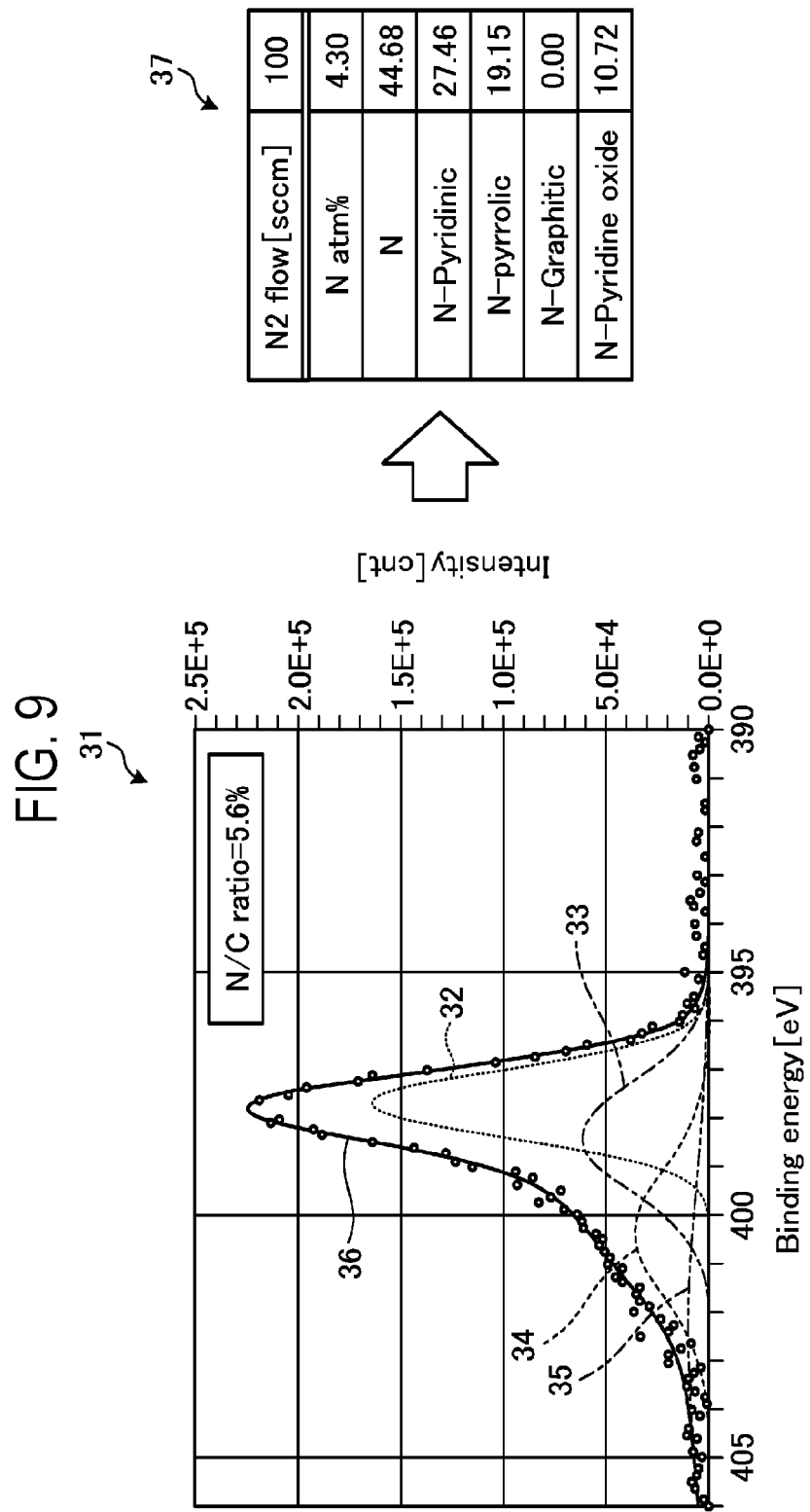
FIG. 9 is a diagram illustrating an example of the experimental results of sequence SE1.

FIG. 9 is a diagram illustrating an example of the experimental results of sequence SE1. Graph 31 illustrated in FIG. 9 represents the results of X-ray Photoelectron Spectroscopy (XPS) measurement when performing fitting on an edge portion of the substrate W subjected to sequence SE1. In addition, graph 31 is data excluding background components. In sequence SE1, the ratio of nitrogen (N) doped into graphene to carbon (C) (N/C ratio) was 5.6%. Graph 32 represents nitrogen (N) reacted with silicon (Si) of the substrate W. Graph 33 represents pyridinic type 23. Graph 34 represents pyrrolic type 22. Graph 35 represents pyridine oxide type 24. Graph 36 is the sum of graphs 32 to 35.

Table 37 summarizes the results of graph 31. In sequence SE1, the flow rate of the $N_2$ gas was 100 sccm. At this time, the total amount of nitrogen (N atm %) within the observation range of XPS measurement was 4.30 atm %. The nitrogen (N) corresponding to graph 32 was 44.68% of the total amount. Pyridinic type 23 (N-pyridinic) corresponding to graph 33 was 27.46% of the total amount. Pyrrolic type 22 (N-pyrrolic) corresponding to graph 34 was 19.15% of the total amount. Graphitic type 21 (N-Graphitic) was 0.00% of the total amount. Pyridine oxide type 24 (N-pyridine oxide) corresponding to graph 35 was 10.72% of the total amount. In addition, the ratio of the total amount corresponds to the area ratio in graph 31. From graph 31 and table 37 that, it can be confirmed that, in sequence SE1, the peak of graph 32 corresponding to the total amount of nitrogen is prominent, and the peaks of pyridinic type 23, pyrrolic type 22 and pyridine oxide type 24 are confirmed by fittings.

<Sequence SE2>

Figure 10:
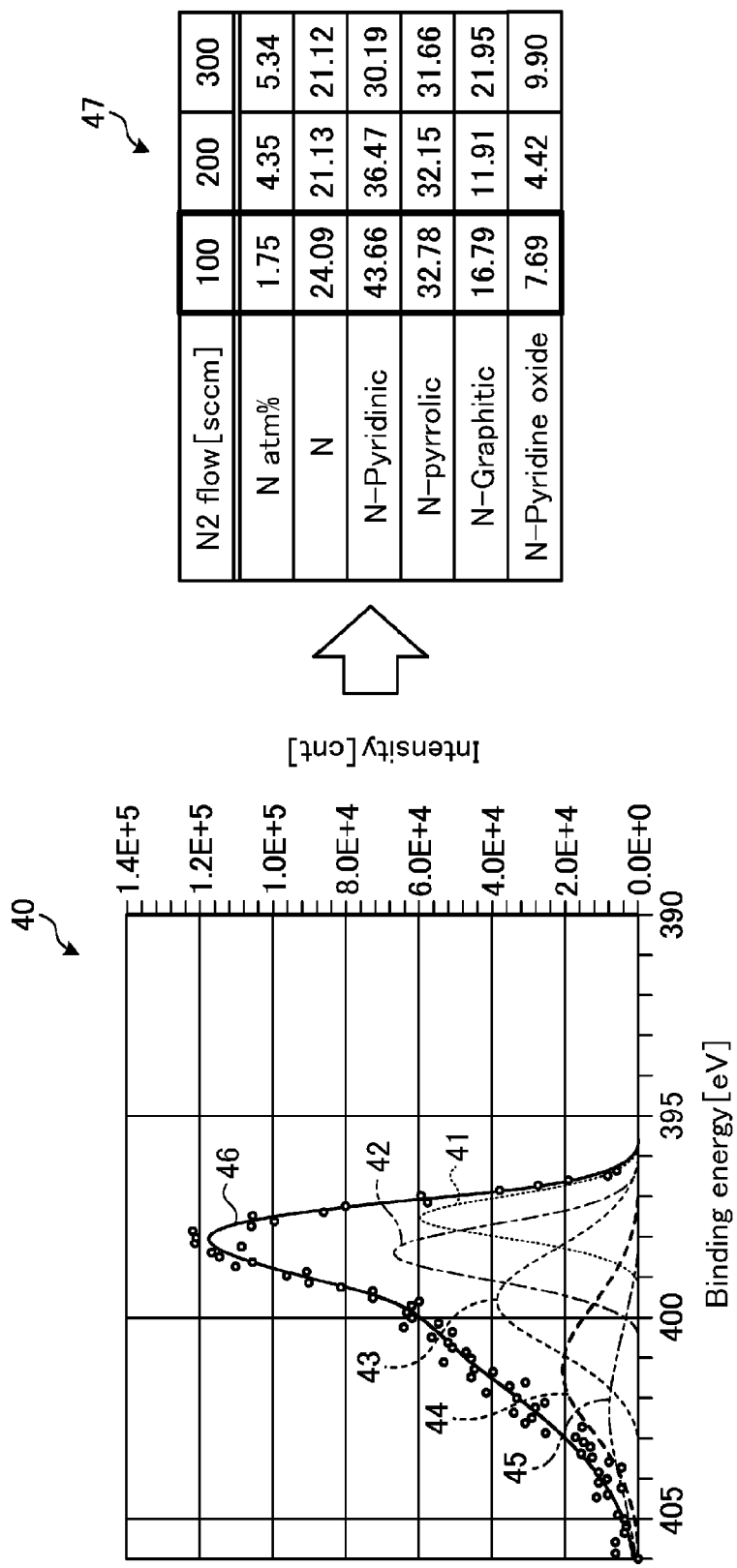
FIG. 10 is a diagram illustrating an example of the experimental results of sequence SE2.

FIG. 10 is a diagram illustrating an example of the experimental results of sequence SE2. Graph 40 illustrated in FIG. 10 represents the results of XPS measurement when performing fitting on an edge portion of the substrate W subjected to sequence SE2. Further, graph 40 is data excluding background components. In addition, in sequence SE2, when the flow rate of the $N_2$ gas was 100 sccm, the ratio of nitrogen (N) to carbon (C) (N/C ratio) was 2.1%. Graph 41 represents nitrogen (N) reacted with silicon (Si) of the substrate W. Graph 42 represents pyridinic type 23. Graph 43 represents pyrrolic type 22. Graph 44 represents graphitic type 21. Graph 45 represents pyridine oxide type 24. Graph 46 is the sum of graphs 41 to 45.

Table 47 consolidates the summarized results of graph 40 with the $N_2$ gas flow rate of 100 sccm (in the bold frame), the results with the $N_2$ gas flow rate of 200 sccm, and the results with the $N_2$ gas flow rate of 300 sccm. As illustrated in table 47, when the $N_2$ gas flow rate was 100 sccm, the total amount of nitrogen (N atm %) within the observation range of XPS measurement was 1.75 atm %. The nitrogen (N) corresponding to graph 41 was 24.09% of the total amount. Pyridinic type 23 corresponding to graph 42 was 43.66% of the total amount. Pyrrolic type 22 corresponding to graph 43 was 32.78% of the total amount. Graphitic type 21 corresponding to graph 44 was 16.79% of the total amount. Pyridine oxide type 24 corresponding to graph 45 was 7.69% of the total amount. In addition, the ratio of the total amount corresponds to the area ratio in graph 40.

When the $N_2$ gas flow rate was 200 sccm, the total amount of nitrogen within the observation range of XPS measurement was 4.35 atm %. Nitrogen (N) reacted with Si of the substrate W was 21.13% of the total amount. Pyridinic type 23 was 36.47% of the total amount. Pyrrolic type 22 was 32.15% of the total amount. Graphitic type 21 was 11.91% of the total amount. Pyridine oxide type 24 was 4.42% of the total amount.

When the $N_2$ gas flow rate was 300 sccm, the total amount of nitrogen within the observation range of XPS measurement was 5.34 atm %. Nitrogen (N) reacted with Si of the substrate W was 21.12% of the total amount. Pyridinic type 23 was 30.19% of the total amount. Pyrrolic type 22 was 31.66% of the total amount. Graphitic type 21 was 21.95% of the total amount. Pyridine oxide type 24 was 9.90% of the total amount. Referring to graph 40 and table 47, in sequence SE2, the total amount of nitrogen and graphitic type 21 increased as the $N_2$ gas flow rate increased. Further, there was no significant change in nitrogen (N), pyridinic type 23, pyrrolic type 22, and pyridine oxide type 24 regardless of the $N_2$ gas flow rate.

<Comparison Between Sequences SE1 and SE2>

FIG. 11 is a diagram illustrating an example of comparing the experimental results between sequence SE1 and sequence SE2. Table 48 illustrated in FIG. 11 summarizes the experimental results of sequence SE1 and sequence SE2. As illustrated in table 48, in sequence SE1, the processing time of the second process was 80 seconds, and in sequence SE2, the processing time of the first process was 48 seconds and the processing time of the second process was 30 seconds. Further, the $N_2$ gas flow rate was 100 sccm in both the sequences. By comparing the experimental results of sequence SE1 and sequence SE2, it can be seen that they differ in terms of nitrogen doping levels and locations where nitrogen substitution easily occurs. Sequence SE2 exhibited lower ratios of the nitrogen (N) reacted with Si of the substrate W and pyridine oxide type 24 and higher ratios of pyridinic type 23, pyrrolic type 22, and graphitic type 21 compared to sequence SE1.

<Sequence SE3>

Figure 12:
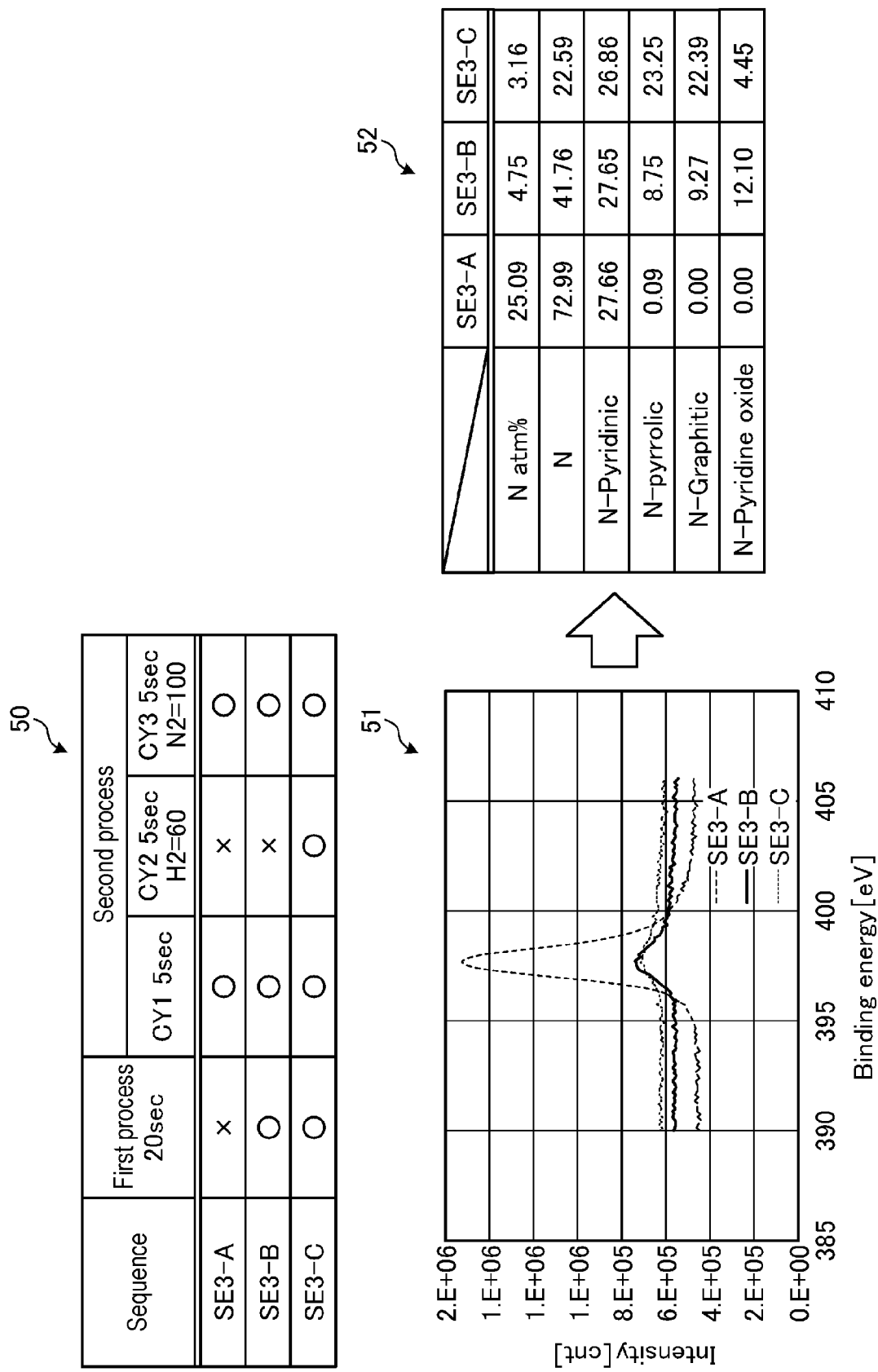
FIG. 12 is a diagram illustrating an example of the experimental results of sequence SE3.

FIG. 12 is a diagram illustrating an example of the experimental results of sequence SE3. Table 50 illustrated in FIG. 12 consolidates the results for the first and second processes of sequences SE3-A, SE3-B, and SE3-C. The processing time of the first process was 20 seconds, and the processing times of cycles CY1 to CY3 of the second process were 5 seconds, respectively. Further, the $H_2$ gas flow rate of cycle CY2 was 60 sccm, and the $N_2$ gas flow rate of cycle CY3 was 100 sccm. In table 50, the O mark indicates that the process or cycle is executed, while the X mark indicates that the process or cycle is not executed. Further, a predetermined number of cycles of the second process was 8 cycles for sequence SE3-A and 6 cycles for sequences SE3-B and SE3-C.

Graph 51 represents the results of XPS measurement for the substrate W subjected to sequences SE3-A, SE3-B, and SE3-C, respectively. Table 52 summarizes the results of graph 51. As illustrated in table 52, in case of sequence SE3-A, the total amount of nitrogen (N atm %) within the observation range of XPS measurement was 25.09 atm %. Nitrogen (N) reacted with Si of the substrate W was 72.99% of the total amount. Pyridinic type 23 was 27.66% of the total amount. Pyrrolic type 22 was 0.09% of the total amount. Graphitic type 21 was 0.00% of the total amount. Pyridine oxide type 24 was 0.00% of the total amount. Since nitrogen is easily introduced into a film (without substitution), in sequence SE3-A, most of the total amount was nitrogen (N) reacted with Si of the substrate W, and the next significant ratio was pyridinic type 23.

In case of sequence SE3-B, the total amount of nitrogen within the observation range of XPS measurement was 4.75 atm %. Nitrogen (N) reacted with Si of the substrate W was 41.76% of the total amount. Pyridinic type 23 was 27.65% of the total amount. Pyrrolic type 22 was 8.75% of the total amount. Graphitic type 21 was 9.27% of the total amount. Pyridine oxide type 24 was 12.10% of the total amount. Sequence SE3-B exhibited a higher ratio of pyridine oxide type 24 compared to sequences SE3-A and SE3-C.

In sequence SE3-C, the total amount of nitrogen within the observation range of XPS measurement was 3.16 atm %. Nitrogen (N) reacted with Si of the substrate W was 22.59% of the total amount. Pyridinic type 23 was 26.86% of the total amount. Pyrrolic type 22 was 23.25% of the total amount. Graphitic type 21 was 22.39% of the total amount. Pyridine oxide type 24 was 4.45% of the total amount. Sequence SE3-C exhibited a higher ratio of graphitic type 21 compared to sequences SE3-A and SE3-B.

<Sequence SE4>

Figure 13:
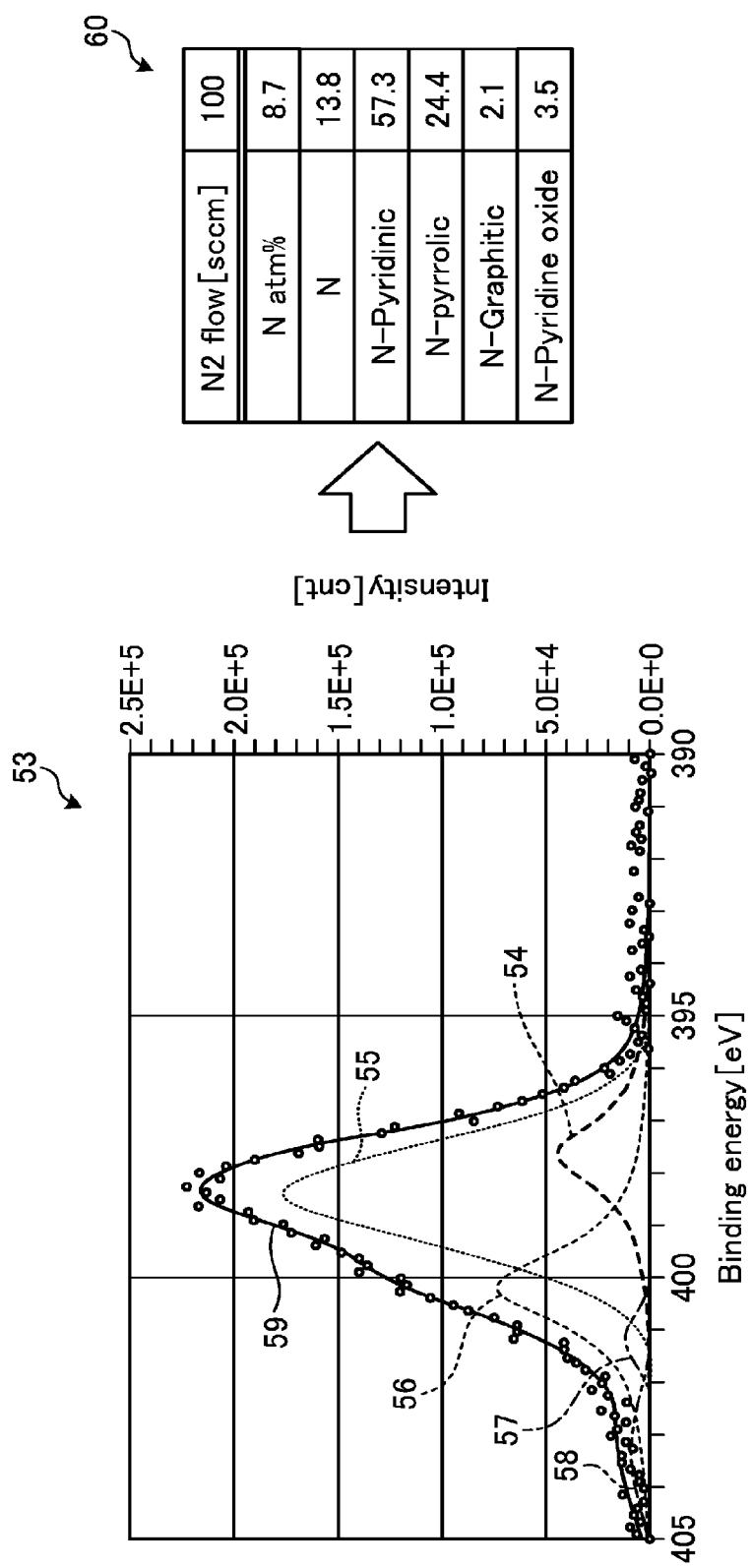
FIG. 13 is a diagram illustrating an example of the experimental results of sequence SE4.
Figure 14:
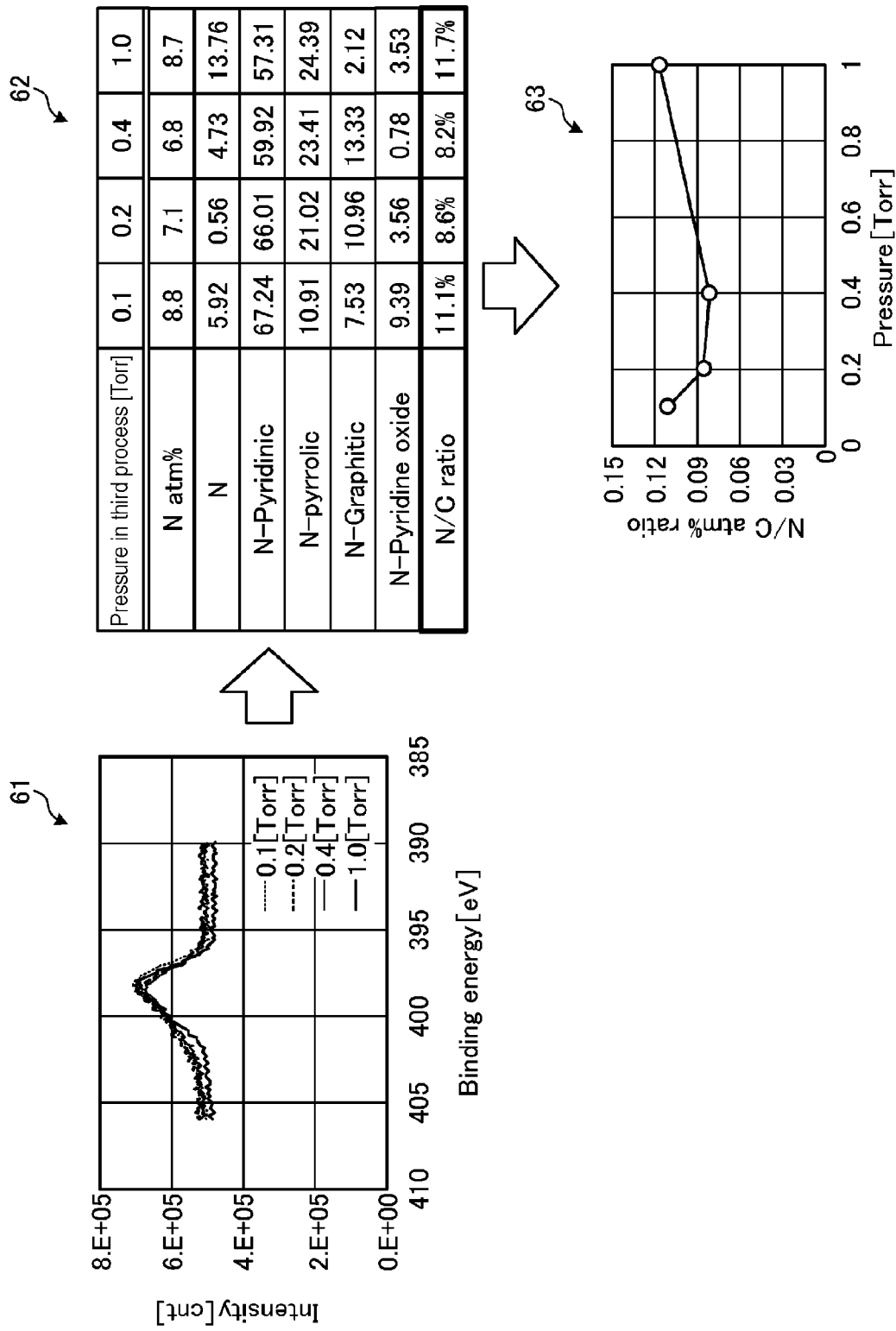
FIG. 14 is a diagram illustrating an example of the experimental results of sequence SE4.
Figure 15:
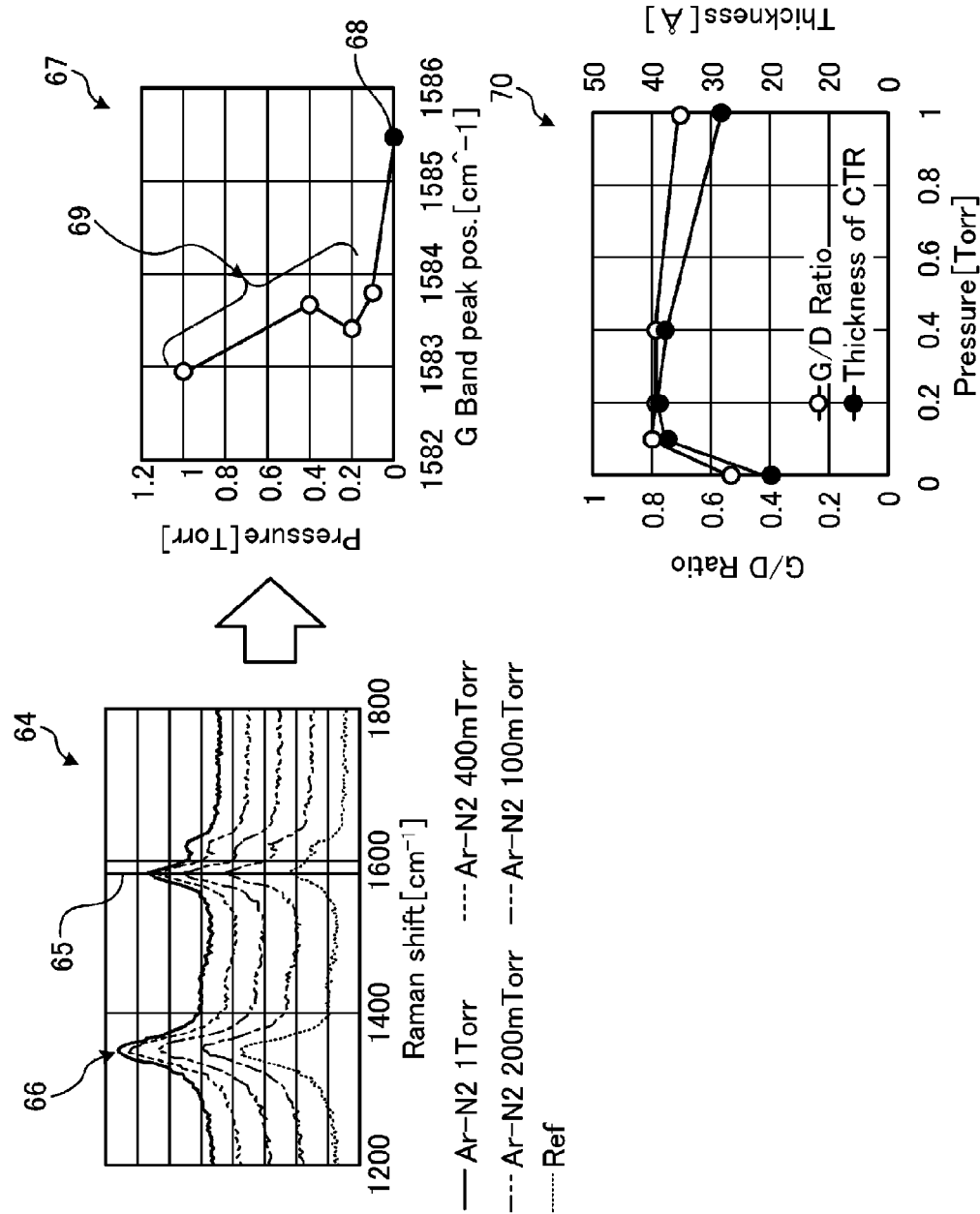
FIG. 15 is a diagram illustrating an example of the experimental results of sequence SE4.

FIGS. 13 to 15 are diagrams illustrating an example of the experimental results of sequence SE4. Graph 53 illustrated in FIG. 13 represents the results of XPS measurement for the substrate W subjected to sequence SE4 with the processing time of the first process of 50 seconds and the internal pressure of the chamber 101 of 1.0 Torr in the third process. Further, graph 53 is data excluding background components. Graph 54 represents nitrogen (N) reacted with silicon (Si) of the substrate W. Graph 55 represents pyridinic type 23. Graph 56 represents pyrrolic type 22. Graph 57 represents graphitic type 21. Graph 58 represents pyridine oxide type 24. Graph 59 is the sum of graphs 54 to 58.

Table 60 summarizes the results of graph 53. As illustrated in table 60, in sequence SE4, the $N_2$ gas flow rate was 100 sccm. At this time, the total amount of nitrogen (N atm %) within the observation range of XPS measurement was 8.7 atm %. The nitrogen (N) corresponding to graph 54 was 13.8% of the total amount. Pyridinic type 23 corresponding to graph 55 was 57.3% of the total amount. Pyrrolic type 22 corresponding to graph 56 was 24.4% of the total amount. Graphitic type 21 corresponding to graph 57 was 2.1% of the total amount. Pyridine oxide type 24 corresponding to graph 58 was 3.5% of the total amount. In addition, the ratio of the total amount corresponds to the area ratio in graph 53. From graph 53 and table 60, in sequence SE4, pyridinic type 23 was dominant, followed by pyrrolic type 22.

Graph 61 illustrated in FIG. 14 represents the results of XPS measurement for a central portion of the substrate W subjected to sequence SE4 when changing the internal pressure of the chamber 101 in the third process to 0.1 Torr, 0.2 Torr, 0.4 Torr, and 1.0 Torr, respectively. In addition, the third processing gas, which is a mixed gas of an Ar gas and $N_2$ gas, was supplied into the chamber 101 in the third process. Further, the processing time of the third process was 50 seconds as in FIG. 13.

Table 62 summarizes the results of performing fitting in graph 61. As illustrated in table 62, when the pressure was 0.1 Torr, the total amount of nitrogen (N atm %) within the observation range of XPS measurement was 8.8 atm %. Nitrogen (N) reacted with Si of the substrate W was 5.92% of the total amount. Pyridinic type 23 was 67.24% of the total amount. Pyrrolic type 22 was 10.91% of the total amount. Graphitic type 21 was 7.53% of the total amount. Pyridine oxide type 24 was 9.39% of the total amount. The ratio of nitrogen (N) to carbon (C) (N/C ratio) was 11.1%.

When the pressure was 0.2 Torr, the total amount of nitrogen within the observation range of XPS measurement was 7.1 atm %. Nitrogen (N) reacted with Si of the substrate W was 0.56% of the total amount. Pyridinic type 23 was 66.01% of the total amount. Pyrrolic type 22 was 21.02% of the total amount. Graphitic type 21 was 10.96% of the total amount. Pyridine oxide type 24 was 3.56% of the total amount. The ratio of nitrogen (N) to carbon (C) (N/C ratio) was 8.6%.

When the pressure was 0.4 Torr, the total amount of nitrogen within the observation range of XPS measurement was 6.8 atm %. Nitrogen (N) reacted with Si of the substrate W was 4.73% of the total amount. Pyridinic type 23 was 59.92% of the total amount. Pyrrolic type 22 was 23.41% of the total amount. Graphitic type 21 was 13.33% of the total amount. Pyridine oxide type 24 was 0.78% of the total amount. The ratio of nitrogen (N) to carbon (C) (N/C ratio) was 8.2%.

When the pressure was 1.0 Torr, the total amount of nitrogen within the observation range of XPS measurement was 8.7 atm %. Nitrogen (N) reacted with Si of the substrate W was 13.76% of the total amount. Pyridinic type 23 was 57.31% of the total amount. Pyrrolic type 22 was 24.39% of the total amount. Graphitic type 21 was 2.12% of the total amount. Pyridine oxide type 24 was 3.53% of the total amount. The ratio of nitrogen (N) to carbon (C) (N/C ratio) was 11.7%.

Graph 63 represents the ratio of nitrogen (N) to carbon (C) (N/C ratio). As illustrated in graph 63, it can be said that the ratio of nitrogen (N) to carbon (C) (N/C atm % ratio) does not change significantly with a change in the internal pressure of the chamber 101 in the third process, and thus, has little pressure dependency. Further, it can be said from Table 62 that the total amount of nitrogen also does not change significantly and has little pressure dependency.

It can be seen from Table 62 that pyridinic type 23 and pyrrolic type 22 are dominant regardless of the pressure. Further, the ratio of pyrrolic type 22 increased as the pressure increased.

Graph 64 illustrated in FIG. 15 represents the results of Raman spectroscopy measurement for the substrate W when only the first process was performed (Ref) and when the internal pressure of the chamber 101 in the third process was changed to 0.1 Torr, 0.2 Torr, 0.4 Torr, and 1.0 Torr, respectively. Peak 65 represents G-band, and peak 66 represents D-band. Graph 67 represents a change in peak 65 depending on each pressure. Taking peak 65, obtained when only the first process was performed (Ref), as the reference value 68, it can be seen that the peak of measurement result 69 at each pressure in the third process shifted as the pressure increased. In other words, it can be seen that graphene reacts with nitrogen at each pressure, resulting in a change in the state of graphene. Graph 70 represents the reference value 68, the G/D ratio at each pressure, and the film thickness at a central portion of the substrate W (Thickness of CTR). In addition, the G/D ratio is the ratio of G-band to D-band. It may appear from graph 70 that nitrogen-doped graphene has a good G/D ratio, but this is considered to be attributable to the film thickness. Further, there was no apparent damage on the surface of the doped graphene film.

<Comparison Between Sequences SE4 and SE8>

Figure 16:
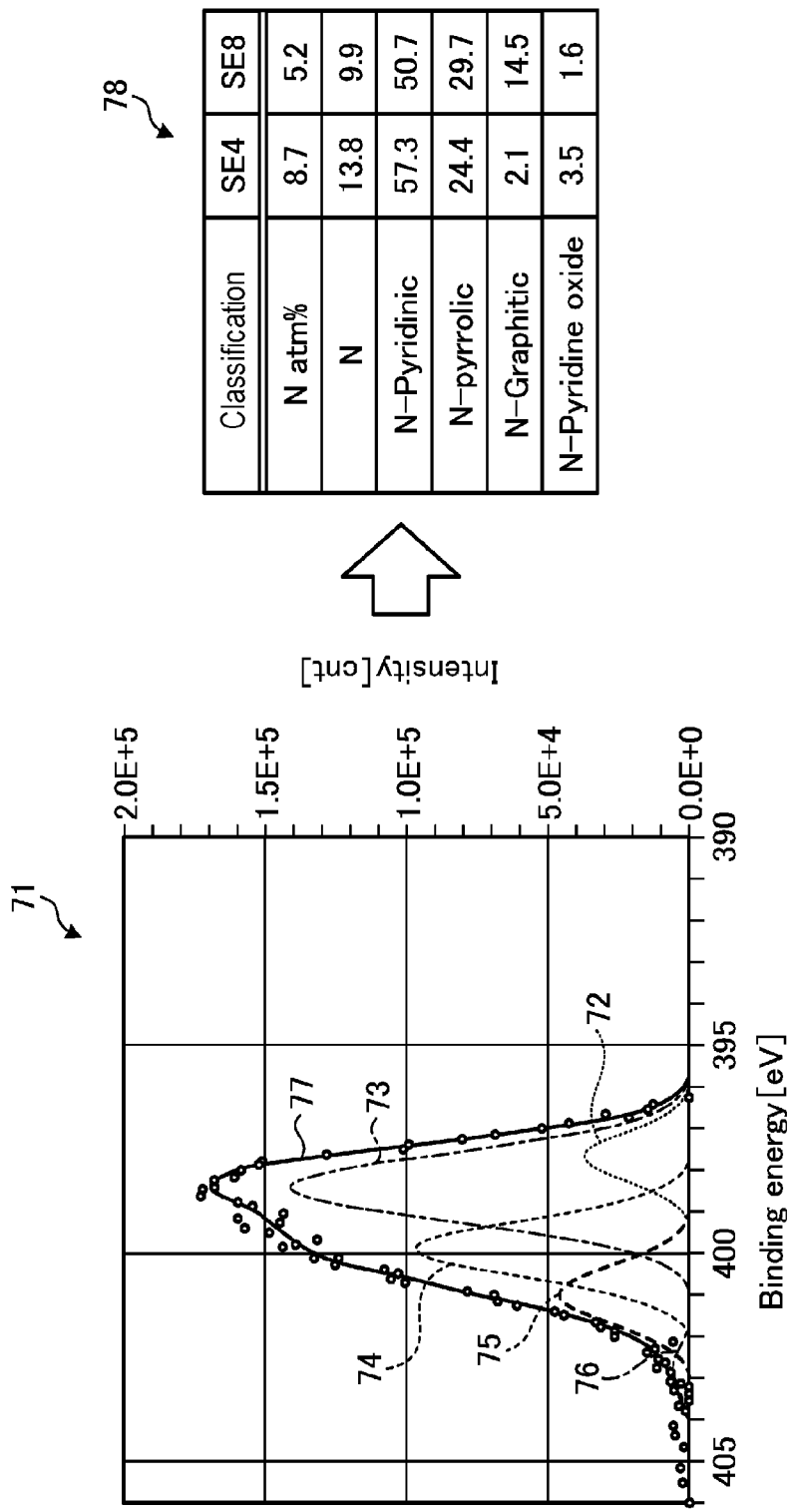
FIG. 16 is a diagram illustrating an example of comparing the experimental results between sequence SE4 and sequence SE8.

FIG. 16 is a diagram illustrating an example of comparing the experimental results between sequence SE4 and sequence SE8. Graph 71 illustrated in FIG. 16 represents the results of XPS measurement for the substrate W subjected to sequence SE8 with the processing time of the first process of 75 seconds and the internal pressure of the chamber 101 of 1.0 Torr in the third and fourth processes. Further, graph 71 is data excluding background components. Graph 72 represents nitrogen (N) reacted with silicon (Si) of the substrate W. Graph 73 represents pyridinic type 23. Graph 74 represents pyrrolic type 22. Graph 75 represents graphitic type 21. Graph 76 represents pyridine oxide type 24. Graph 77 is the sum of graphs 72 to 76. In addition, the graph of the results of XPS measurement of sequence SE4 is the same as graph 53 in FIG. 13, and thus, is omitted.

Table 78 summarizes the results of sequence SE4 and sequence SE8. As illustrated in Table 78, in case of sequence SE4, the total amount of nitrogen (N atm %) within the observation range of XPS measurement was 8.7 atm %. Nitrogen (N) reacted with Si of the substrate W was 13.8% of the total amount. Pyridinic type 23 was 570.3% of the total amount. Pyrrolic type 22 was 24.4% of the total amount. Graphitic type 21 was 2.1% of the total amount. Pyridine oxide type 24 was 3.5% of the total amount. In addition, in sequence SE4, the processing time of the first process was 75 seconds, and the internal pressure of the chamber 101 in the third process was 1.0 Torr.

In sequence SE8, the total amount of nitrogen within the observation range of XPS measurement was 5.2 atm %. The nitrogen (N) corresponding to graph 72 was 9.9% of the total amount. Pyridinic type 23 corresponding to graph 73 was 50.7% of the total amount. Pyrrolic type 22 corresponding to graph 74 was 29.7% of the total amount. Graphitic type 21 corresponding to graph 75 was 14.5% of the total amount. Pyridine oxide type 24 corresponding to graph 76 was 1.6% of the total amount. In addition, the ratio of the total amount corresponds to the area ratio in graph 71.

Comparing the results of sequence SE4 and sequence SE8, sequence SE8 exhibited an increased ratio of graphitic type 21. Further, it can be seen that the predominance of pyridinic type 23 and pyrrolic type 22 does not change in both sequence SE4 and sequence SE8.

<Comparison Between Sequences SE9 and SE10>

Figure 17:
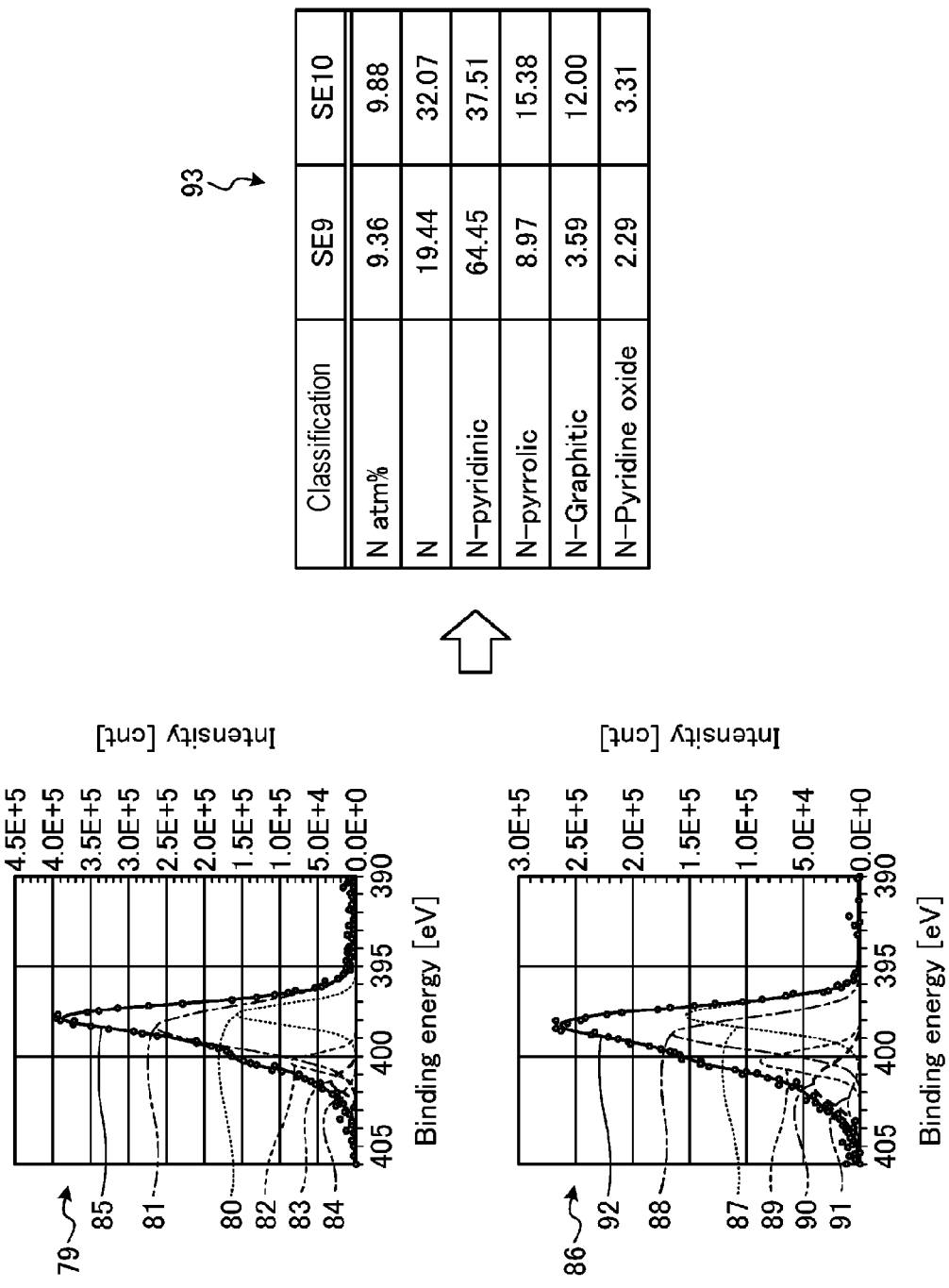
FIG. 17 is a diagram illustrating an example of comparing the experimental results between sequence SE9 and sequence SE10.

FIG. 17 is a diagram illustrating an example of comparing the experimental results between sequence SE9 and sequence SE10. Graph 79 illustrated in FIG. 17 represents the results of XPS measurement for the substrate W subjected to sequence SE9 with the processing time of the second process of 80 seconds and the internal pressure of the chamber 101 of 1.0 Torr in the third and fourth processes. Further, graph 79 is data excluding background components. Graph 80 represents nitrogen (N) reacted with silicon (Si) of the substrate W. Graph 81 represents pyridinic type 23. Graph 82 represents pyrrolic type 22. Graph 83 represents graphitic type 21. Graph 84 represents pyridine oxide type 24. Graph 85 is the sum of graphs 80 to 84.

Graph 86 represents the results of XPS measurement for the substrate W subjected to sequence SE10 with the processing time of the first process of 48 seconds, the processing time of the second process of 30 seconds, and the internal pressure of the chamber 101 of 1.0 Torr in the third and fourth processes. Further, graph 86 is data excluding background components. Graph 87 represents nitrogen (N) reacted with silicon (Si) of the substrate W. Graph 88 represents pyridinic type 23. Graph 89 represents pyrrolic type 22. Graph 90 represents graphitic type 21. Graph 91 represents pyridine oxide type 24. Graph 92 is the sum of graphs 87 to 91.

Table 93 summarizes the results of sequence SE9 and sequence SE10. As illustrated in Table 93, in a case of sequence SE9, the total amount of nitrogen (N atm %) within the observation range of XPS measurement was 9.36 atm %. The nitrogen (N) corresponding to graph 80 was 19.44% of the total amount. Pyridinic type 23 corresponding to graph 81 was 64.45% of the total amount. Pyrrolic type 22 corresponding to graph 82 was 8.97% of the total amount. Graphitic type 21 corresponding to graph 83 was 3.59% of the total amount. Pyridine oxide type 24 corresponding to graph 84 was 2.29% of the total amount. In addition, the ratio of the total amount corresponds to the area ratio in graph 79.

In sequence SE10, the total amount of nitrogen within the observation range of XPS measurement was 9.88 atm %. The nitrogen (N) corresponding to graph 87 was 32.07% of the total amount. Pyridinic type 23 corresponding to graph 88 was 37.51% of the total amount. Pyrrolic type 22 corresponding to graph 89 was 15.38% of the total amount. Graphitic type 21 corresponding to graph 90 was 12.00% of the total amount. Pyridine oxide type 24 corresponding to graph 91 was 3.31% of the total amount. In addition, the ratio of the total amount corresponds to the area ratio in graph 86.

Comparing the results of sequence SE9 and sequence SE10, it can be seen that sequence SE10 exhibited a higher ratio of graphitic type 21. Further, it can be seen that in sequence SE9, the ratio of pyridinic type 23 is particularly high. As represented by the above-described experimental results, the ratio of nitrogen-doped positions with respect to the graphene film may be controlled by using each sequence.

In addition, in the above-described embodiment, the cleaning process was executed for each substrate W which is a processing target, but the cleaning process may be performed, for example, after the processing of a plurality of substrates W for each lot.

As described above, according to the present embodiment, the film forming apparatus 1 includes a processing container (chamber 101) capable of accommodating the substrate W and the controller 11. The controller 11 executes a loading process of loading the substrate W into the processing container, a first process of forming a graphene film on the substrate W using plasma of a first processing gas that includes a carbon-containing gas, and a second process of forming a doped graphene film on at least one of the substrate W and the graphene film using plasma of a second processing gas that includes a dopant gas. As a result, it is possible to control the ratio of nitrogen-doped positions with respect to the graphene film.

Further, according to the present embodiment, the first processing gas includes a hydrogen-containing gas having a first flow rate. As a result, it is possible to control the formation of the graphene film.

Further, according to the present embodiment, the second processing gas includes the first processing gas. As a result, transition from the first process to the second process is possible while maintaining the plasma.

Further, according to the present embodiment, in the second process, the doped graphene film is formed using the plasma of the second processing gas while intermittently supplying the dopant gas. As a result, it is possible to increase the ratio of pyridinic type 23.

Further, according to the present embodiment, in the second process, a hydrogen-containing gas having a second flow rate is supplied before the intermittent supply of the dopant gas. As a result, it is possible to increase the ratios of graphitic type 21 and pyridinic type 23.

Further, according to the present embodiment, there is provided a third process of processing at least one of the graphene film and the doped graphene film using plasma of a third processing gas that includes the dopant gas and an Ar gas. As a result, it is possible to control the ratio of nitrogen-doped positions with respect to the graphene film.

Further, according to the present embodiment, the first processing gas includes the dopant gas, and the second processing gas includes an argon gas. As a result, it is possible to control the ratio of nitrogen-doped positions with respect to the graphene film.

Further, according to the present embodiment, there is provided a fourth process of processing at least one of the graphene film and the doped graphene film using plasma of a fourth processing gas that includes the dopant gas and does not include an Ar gas. As a result, it is possible to control the ratio of nitrogen-doped positions with respect to the graphene film.

Further, according to the present embodiment, the dopant gas contains at least one of nitrogen and boron. As a result, it is possible to control the ratio of doped positions of at least one of nitrogen and boron with respect to the graphene film.

Further, according to the present embodiment, the flow rate of the second processing gas in the second process is different from the flow rate of the first processing gas in the first process. As a result, it is possible to control the ratio of nitrogen-doped positions with respect to the graphene film.

Further, according to the present embodiment, the plasma is microwave plasma. As a result, it is possible to realize nitrogen doping with low ion energy and low damage by using a $N_2$ gas as a dopant gas. Further, it is possible to control the ratio of nitrogen-doped positions with respect to the graphene film.

The embodiments disclosed herein should be considered to be exemplary and not limitative in all respects. The above embodiments may be omitted, replaced or modified in various embodiments without departing from the scope of the appended claims and their gist.

Further, the above-described embodiments have described the film forming apparatus 1 that performs processes such as etching or film formation on the substrate W using microwave plasma as a plasma source by way of example, but the technology of the disclosure is not limited thereto. As long as the apparatus performs processes on the substrate W using plasma, the plasma source is not limited to the microwave plasma, and any plasma source such as capacitively coupled plasma, inductively coupled plasma, or magnetron plasma may be used.

In addition, the present disclosure may also take the following configurations.

(1) A film forming method of forming a graphene film, including:
- a loading process of loading a substrate into a processing container;
- a first process of forming the graphene film on the substrate using plasma of a first processing gas that includes a carbon-containing gas; and
- a second process of forming a doped graphene film on at least one of the substrate and the graphene film using plasma of a second processing gas that includes a dopant gas.

(2) The film forming method set forth in (1), wherein the first processing gas includes a hydrogen-containing gas having a first flow rate.

(3) The film forming method set forth in (1) or (2), wherein the second processing gas includes the first processing gas.

(4) The film forming method set forth in any of (1) to (3), wherein in the second process, the doped graphene film is formed using the plasma of the second processing gas while intermittently supplying the dopant gas.

(5) The film forming method set forth in (4), wherein in the second process, a hydrogen-containing gas having a second flow rate is supplied before the intermittent supply of the dopant gas.

(6) The film forming method set forth in any of (1) to (5), further comprising a third process of processing at least one of the graphene film and the doped graphene film using plasma of a third processing gas that includes the dopant gas and an Ar gas.

(7) The film forming method set forth in (1), wherein the first processing gas includes the dopant gas, and the second processing gas includes an argon gas.

(8) The film forming method set forth in any of (1) to (7), further comprising a fourth process of processing at least one of the graphene film and the doped graphene film using plasma of a fourth processing gas that includes the dopant gas and does not include an Ar gas.

(9) The film forming method set forth in any of (1) to (8), wherein the dopant gas contains at least one of nitrogen and boron.

(10) The film forming method set forth in any of (1) to (9), wherein the flow rate of the second processing gas in the second process is different from the flow rate of the first processing gas in the first process.
(11) The film forming method set forth in any of (1) to (10), wherein the plasma is microwave plasma.
(12) A film forming apparatus including:
  a processing container capable of accommodating a substrate; and
  a controller,
  wherein the controller is configured to be able to control the film forming apparatus so as to load the substrate into the processing container,
  wherein the controller is configured to be able to control the film forming apparatus so as to form a graphene film on the substrate using plasma of a first processing gas that includes a carbon-containing gas; and
  wherein the controller is configured to be able to control the film forming apparatus so as to form a doped graphene film on at least one of the substrate and the graphene film using plasma of a second processing gas that includes a dopant gas.

EXPLANATION OF REFERENCE NUMERALS

1: film forming apparatus, 11: controller, 20: grain, 21: graphitic type, 22: pyrrolic type, 23: pyridinic type, 24: pyridine oxide type, 101: chamber, 102: stage, 103: microwave introduction mechanism, 104: gas supply mechanism, 105: exhaust mechanism, SE1 to SE11: sequence, W: substrate

What is claimed is:

1. A film forming method of forming a graphene film, comprising:
  a loading process of loading a substrate into a processing container;
  a first process of forming the graphene film on the substrate using plasma of a first processing gas that includes a carbon-containing gas; and
  after the first process, a second process of forming a doped graphene film on at least one of the substrate and the graphene film using plasma of a second processing gas that includes a dopant gas while maintaining the plasma of the first processing gas.

2. The film forming method of claim 1, wherein the first processing gas includes a hydrogen-containing gas having a first flow rate.

3. The film forming method of claim 1, wherein the second processing gas includes the first processing gas.

4. The film forming method of claim 1, wherein in the second process, the doped graphene film is formed using the plasma of the second processing gas while intermittently supplying the dopant gas.

5. The film forming method of claim 4, wherein in the second process, a hydrogen-containing gas having a second flow rate is supplied before the intermittent supply of the dopant gas.

6. The film forming method of claim 1, further comprising a third process of processing at least one of the graphene film and the doped graphene film using plasma of a third processing gas that includes the dopant gas and an Ar gas.

7. The film forming method of claim 1, wherein the first processing gas includes the dopant gas, and the second processing gas includes an argon gas.

8. The film forming method of claim 1, further comprising a fourth process of processing at least one of the graphene film and the doped graphene film using plasma of a fourth processing gas that includes the dopant gas and does not include an Ar gas.

9. The film forming method of claim 1, wherein the dopant gas contains at least one of nitrogen and boron.

10. The film forming method of claim 1, wherein a flow rate of the second processing gas in the second process is different from a flow rate of the first processing gas in the first process.

11. The film forming method of claim 1, wherein the plasma is microwave plasma.

12. The film forming method of claim 2, wherein the second processing gas includes the first processing gas.

\* \* \* \* \*